US012740477B2

(12) United States Patent
Kim

(10) Patent No.: US 12,740,477 B2
(45) Date of Patent: Sep. 15, 2026

(54) DISPLAY DEVICE

(71) Applicant: Samsung Display Co., LTD., Yongin-si (KR)

(72) Inventor: Jae Hoon Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 866 days.

(21) Appl. No.: 17/868,216

(22) Filed: Jul. 19, 2022

(65) Prior Publication Data

US 2023/0207543 A1 Jun. 29, 2023

(30) Foreign Application Priority Data

Dec. 23, 2021 (KR) ........................ 10-2021-0186434

(51) Int. Cl.

| | |
|---|---|
| ***H10H 20/857*** | (2025.01) |
| ***H10D 86/40*** | (2025.01) |
| ***H10D 86/60*** | (2025.01) |
| ***H10W 70/60*** | (2026.01) |
| ***H10W 90/00*** | (2026.01) |

(Continued)

(52) U.S. Cl.

CPC .......... *H10W 90/00* (2026.01); *H10D 86/441* (2025.01); *H10D 86/451* (2025.01); *H10D 86/60* (2025.01); *H10H 20/857* (2025.01); *H10W 70/60* (2026.01); *H10W 70/654* (2026.01); *H10W 90/22* (2026.01)

(58) Field of Classification Search

CPC ....... H01L 25/167; H01L 24/24; H01L 24/25; H01L 2224/24051; H01L 2224/24147; H01L 2224/25175; H01L 2924/12041; H01L 25/0753; H01L 23/544; H10D 86/441; H10D 86/451; H10D 86/60; H10H 20/857; H10H 20/819; H10H 20/856; H10H 20/831; H10H 29/142; H10H 20/841; H10H 20/813; H10W 90/00; H10W 70/60; H10W 70/654; H10W 90/22

See application file for complete search history.

(56) References Cited

U.S. PATENT DOCUMENTS

| | | | |
|---|---|---|---|
| 11,908,848 B2 | 2/2024 | Lee et al. | |
| 2006/0071225 A1* | 4/2006 | Beeson ................ | H10H 20/813 257/98 |

(Continued)

FOREIGN PATENT DOCUMENTS

| | | |
|---|---|---|
| KR | 10-2021-0054119 | 5/2021 |
| KR | 10-2021-0150631 | 12/2021 |

*Primary Examiner* — William B Partridge
*Assistant Examiner* — Erik A. Anderson
(74) *Attorney, Agent, or Firm* — Womble Bond Dickinson (US) LLP

(57) ABSTRACT

A display device includes a plurality of bank patterns disposed on a substrate and spaced apart from each other, a plurality of electrodes disposed on the substrate and extended parallel to each other and spaced apart from each other, an insulating layer disposed on the plurality of electrodes and the plurality of bank patterns, and a plurality of light emitting elements disposed on the insulating layer, having both ends disposed on the plurality of electrodes, wherein the plurality of bank patterns include sides facing each other, and portions of the plurality of light emitting elements are disposed on the sides of the plurality of bank patterns.

14 Claims, 15 Drawing Sheets

(51) Int. Cl.
*H10W 70/654* (2026.01)
*H10W 90/22* (2026.01)

(56) References Cited

U.S. PATENT DOCUMENTS

| | | | | |
|---|---|---|---|---|
| 2006/0176258 | A1* | 8/2006 | Sha | G02F 1/13718 349/96 |
| 2008/0165539 | A1* | 7/2008 | Hsu | H10H 20/856 257/E33.059 |
| 2012/0187424 | A1* | 7/2012 | Kim | H10H 20/813 257/E33.062 |
| 2018/0069062 | A1* | 3/2018 | Ma | H10K 59/878 |
| 2019/0115513 | A1* | 4/2019 | Im | H10H 20/857 |
| 2020/0266318 | A1* | 8/2020 | Lee | H01L 25/0756 |
| 2023/0165055 | A1* | 5/2023 | Kawashima | G06F 3/041 257/40 |
| 2024/0153935 | A1 | 5/2024 | Lee et al. | |

* cited by examiner

FIG. 4

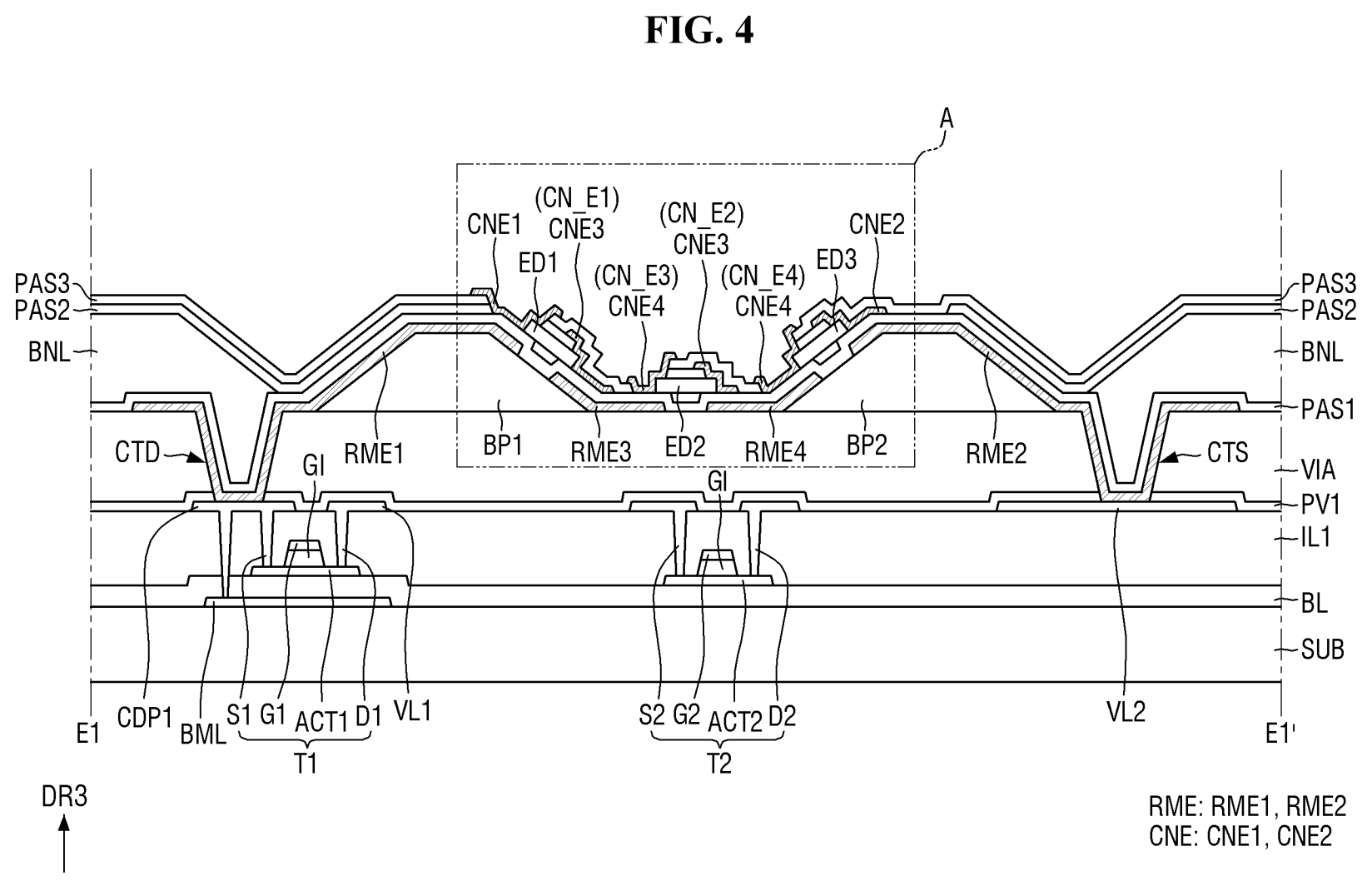

PAS3 PAS2 BNL PAS1 VIA PV1 IL1 BL SUB E1'

RME: RME1, RME2
CNE: CNE1, CNE2

CTS VL2 RME2 A CNE2 ED3 BP2 (CN_E4) CNE4 RME4 D2 (CN_E2) CNE3 ED2 GI ACT2 G2 S2 T2 (CN_E3) CNE4 RME3 (CN_E1) CNE3 ED1 CNE1 BP1 VL1 D1 RME1 ACT1 GI G1 T1 S1 BML CTD CDP1 E1 PAS3 PAS2 BNL DR3

DISPLAY DEVICE

CROSS-REFERENCE TO RELATED APPLICATION

This application claims priority to and benefits of Korean Patent Application No. 10-2021-0186434 under 35 U.S.C. under 35 U.S.C. § 119, filed on Dec. 23, 2021, in the Korean Intellectual Property Office (KIPO), the entire contents of which are incorporated herein by reference.

BACKGROUND

1. Technical Field

The disclosure relates to a display device.

2. Description of the Related Art

With the advancement of multimedia, importance of a display device has been enhanced. Accordingly, various types of display devices such as organic light emitting display (OLED) device and liquid crystal display (LCD) device have been used.

The display device is a device for displaying an image, and includes a display panel such as an organic light emitting display panel or a liquid crystal display panel. The display device may include a light emitting element as a light emitting display panel, and for example, a light emitting diode (LED) includes an organic light emitting diode that uses an organic material as a light emitting material, and an inorganic light emitting diode that uses an inorganic material as a light emitting material.

SUMMARY

An object of the disclosure is to provide a display device that may solve a lighting defect and improve luminance by preventing light emitting elements from being aggregated during alignment of the light emitting elements.

The objects of the disclosure are not limited to those mentioned above and additional objects of the disclosure, which are not mentioned herein, will be clearly understood by those skilled in the art from the following description of the disclosure.

According to an embodiment of the disclosure, a display device may comprise a plurality of bank patterns disposed on a substrate and spaced apart from each other, a plurality of electrodes disposed on the substrate and extended parallel to each other and spaced apart from each other, an insulating layer disposed on the plurality of electrodes and the plurality of bank patterns, and a plurality of light emitting elements disposed on the insulating layer, having both ends disposed on the plurality of electrodes, wherein the plurality of bank patterns may include sides facing each other, and portions of the plurality of light emitting elements may be disposed on the sides of the plurality of bank patterns.

In an embodiment, the plurality of bank patterns may include a first bank pattern extended in a direction and a second bank pattern disposed parallel to the first bank pattern, and the plurality of light emitting elements are disposed on a side of the first bank pattern and a side of the second bank pattern, and between the first bank pattern and the second bank pattern.

In an embodiment, the plurality of electrodes may include a first electrode overlapping the first bank pattern in a plan view, a second electrode overlapping the second bank pattern in a plan view, a third electrode overlapping the first bank pattern in a plan view and disposed between the first electrode and the second electrode, and a fourth electrode overlapping the second bank pattern in a plan view and disposed between the third electrode and the second electrode.

In an embodiment, the plurality of light emitting elements may include a first light emitting element disposed on the first electrode and the third electrode, a second light emitting element disposed on the third electrode and the fourth electrode, and a third light emitting element disposed on the fourth electrode and the second electrode.

In an embodiment, the first light emitting element may overlap the first bank pattern in a plan view, the third light emitting element overlaps the second bank pattern in a plan view, and the second light emitting element does not overlap the first bank pattern and the second bank pattern in a plan view.

In an embodiment, a length direction of the first light emitting element is parallel to the side of the first bank pattern, a length direction of the second light emitting element is parallel to the substrate, and a length direction of the third light emitting element is parallel to the side of the second bank pattern.

In an embodiment, the display device may further comprise a plurality of connection electrodes disposed on the plurality of electrodes, wherein the plurality of connection electrodes may include a first connection electrode electrically contacting a first end of the first light emitting element, a second connection electrode electrically contacting a first end of the third light emitting element, a third connection electrode electrically contacting a second end of the first light emitting element and a first end of the second light emitting element, and a fourth connection electrode electrically contacting a second end of the second light emitting element and a second end of the third light emitting element.

In an embodiment, the first connection electrode and the second connection electrode may be extended parallel to the plurality of electrodes.

In an embodiment, the third connection electrode includes a first extension portion adjacent to the first connection electrode and parallel to the first connection electrode, a second extension portion adjacent to the second connection electrode and parallel to the second connection electrode, and a first connection portion electrically connecting the first extension portion with the second extension portion, and the first extension portion may electrically contact the second end of the first light emitting element and the second extension portion may electrically contact the first end of the second light emitting element.

In an embodiment, the fourth connection electrode may include a third extension portion adjacent to the first connection electrode and parallel to the first connection electrode, a fourth extension portion adjacent to the second connection electrode and parallel to the second connection electrode, and a second connection portion electrically connecting the third extension portion with the fourth extension portion, the third extension portion may electrically contact the second end of the second light emitting element, and the fourth extension portion may electrically contact the second end of the third light emitting element.

In an embodiment, the plurality of bank patterns respectively may include bank holes that pass through the plurality of bank patterns, and reflective layers disposed inside the bank holes.

In an embodiment, the plurality of bank patterns may include bank grooves recessed in a thickness direction from upper surfaces of the plurality of bank patterns, and reflective layers disposed inside the bank grooves.

According to an embodiment of the disclosure, a display device comprises a via layer disposed on a substrate, a first electrode and a second electrode, which are disposed on the via layer and extended parallel in a first direction, an insulating layer disposed on the first electrode and the second electrode, a plurality of light emitting elements disposed on the insulating layer and disposed on the first electrode and the second electrode, a first connection electrode disposed on the insulating layer and electrically contacting first ends of the plurality of light emitting elements, and a second connection electrode electrically contacting second ends of the plurality of light emitting elements, wherein the via layer may include a via groove recessed in a thickness direction from an upper surface of the via layer, and the first electrode, the second electrode and the plurality of light emitting elements may be disposed in the via groove.

In an embodiment, part of the plurality of light emitting elements may be stacked in the thickness direction.

In an embodiment, the first connection electrode may be continuously disposed on the first ends of the plurality of light emitting elements stacked in the thickness direction, and the second connection electrode may be continuously disposed on the second ends of the plurality of light emitting elements stacked in the thickness direction.

In an embodiment, a depth of the via groove may be smaller than a thickness of the via layer, and portions of the plurality of light emitting elements may overlap the via groove in a plan view and may be protruded above the upper surface of the via layer.

In an embodiment, the display device may further comprise a bank layer disposed on the via layer, partitioning a light emission area in which the plurality of light emitting elements are disposed, from a sub-area spaced apart from the light emission area.

In an embodiment, the via groove may be disposed in the light emission area, and is extended parallel to the first electrode.

In an embodiment, the via groove may have a width measured in a second direction intersecting the first direction, the plurality of light emitting elements may have a length extended in the second direction, and the width of the via groove may be greater than the length of the plurality of light emitting elements.

In an embodiment, the first electrode and the second electrode may be spaced apart from each other in the second direction, and an interval between the first electrode and the second electrode may overlap the via groove in a plan view.

In the display device according to the embodiments, as light emitting elements are further aligned on sides of bank patterns, a light emission area of a subpixel may be increased, and the light emitting elements may be prevented from being aggregated. Therefore, a light emitting defect caused by a contact failure of the light emitting elements and connection electrodes may be solved, whereby display quality may be improved.

Also, a reflective layer may be formed in the bank pattern to further improve light emission efficiency of the light emitting elements.

In addition, the light emitting elements are aligned in a via groove of a via layer, and portions of the connection electrodes are respectively in contact with (or contacting) the light emitting elements in the via groove, whereby the light emitting elements may be prevented from being aggregated and luminance may be improved.

The effects according to the embodiments of the disclosure are not limited to those mentioned above and more various effects are included in the following description of the disclosure.

BRIEF DESCRIPTION OF THE DRAWINGS

The above and other aspects and features of the disclosure will become more apparent by describing in detail embodiments thereof with reference to the attached drawings, in which:

FIG. 4 is a schematic cross-sectional view taken along line E1-E1' of FIG. 3;

DETAILED DESCRIPTION OF THE DISCLOSURE

Figure 1:
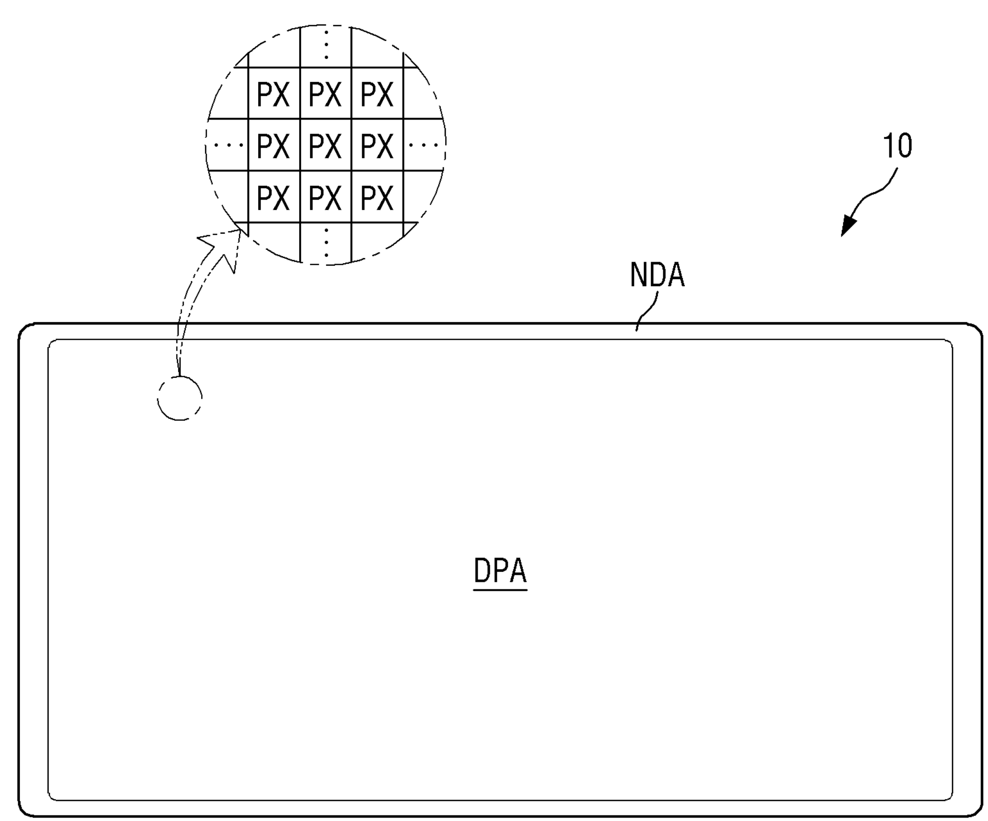
FIG. 1 is a schematic plan view illustrating a display device according to one embodiment.
Figure 1:
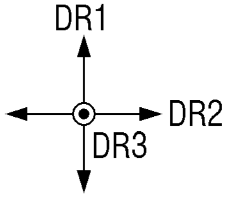

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification. It will be understood that the terms "contact," "connected to," and "coupled to" may include a physical and/or electrical contact, connection, or coupling.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The term "overlap" or "at least partially overlap" as used herein may mean that at least part of a first object faces at least part of a second object in a given direction or given view.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The term "and/or" includes all combinations of one or more of which associated configurations may define. For example, "A and/or B" may be understood to mean "A, B, or A and B."

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Each of the features of the various embodiments of the disclosure may be combined or combined with each other, in part or in whole, and technically various interlocking and driving are possible. Each embodiment may be implemented independently of each other or may be implemented together in an association.

Hereinafter, detailed embodiments of the disclosure will be described with reference to the accompanying drawings.

FIG. 1 is a schematic plan view illustrating a display device according to an embodiment.

Referring to FIG. 1, a display device 10 displays a moving image or a still image. The display device 10 may refer to all electronic devices that provide a display screen. For example, a television, a laptop computer, a monitor, an advertising board, an Internet of things (IoT) device, a mobile phone, a smartphone, a tablet personal computer (PC), an electronic watch, a smartwatch, a watch phone, a head-mounted display, a mobile communication terminal, a digital diary, an electronic-book reader, a portable multimedia player (PMP), a navigator, a game machine, a digital camera, a camcorder, and the like, which provide a display screen, may be included in the display device 10.

The display device 10 includes a display panel for providing a display screen. Examples of the display panel include an inorganic light-emitting diode (LED) display panel, an organic light emitting display panel, a quantum dot light emitting display panel, a plasma display panel, and a field emission display panel. Hereinafter, an inorganic light emitting diode display panel is applied as an example of a display panel, but the example of the display panel is not limited thereto. Another display panel may be used when the same technical spirits are applicable thereto.

Various modifications may be made in a shape of the display device 10. For example, the display device 10 may have a rectangular shape that is long in a horizontal direction, a rectangular shape that is long in a vertical direction, a square shape, a square shape with rounded corners (vertexes), other polygonal shape, a circular shape, etc. A shape of a display area DPA of the display device 10 may also be similar to the overall shape of the display device 10. FIG. 1 illustrates a rectangular display device 10 that is longer in a second direction DR2.

The display device 10 may include a display area DPA and a non-display area NDA. The display area DPA is an area in which an image may be displayed, and the non-display area NDA is an area in which an image is not displayed. The display area DPA may be referred to as an active area, and the non-display area NDA may be referred to as a non-active area. The display area DPA may generally occupy the center of the display device 10.

The display area DPA may include pixels PX. The pixels PX may be disposed in a matrix direction. A shape of each pixel PX may be a rectangular or square shape in a plan view, but is not limited thereto. The shape of each pixel PX may be a rhombic shape in which each side is inclined with respect to a direction. The respective pixels PX may be disposed in a stripe type or an island type. Also, each of the pixels PX may include one or more light emitting elements for emitting light of a specific wavelength band to display a specific color.

The non-display area NDA may be disposed in the vicinity of the display area DPA. The non-display area NDA may fully or partially surround the display area DPA. The display area DPA may have a rectangular shape, and the non-display area NDA may be disposed to be adjacent to four sides of the display area DPA. The non-display area NDA may constitute a bezel of the display device 10. Lines or circuit drivers included in the display device 10 may be disposed in the non-display areas NDA or external devices may be packaged therein.

Figure 2:
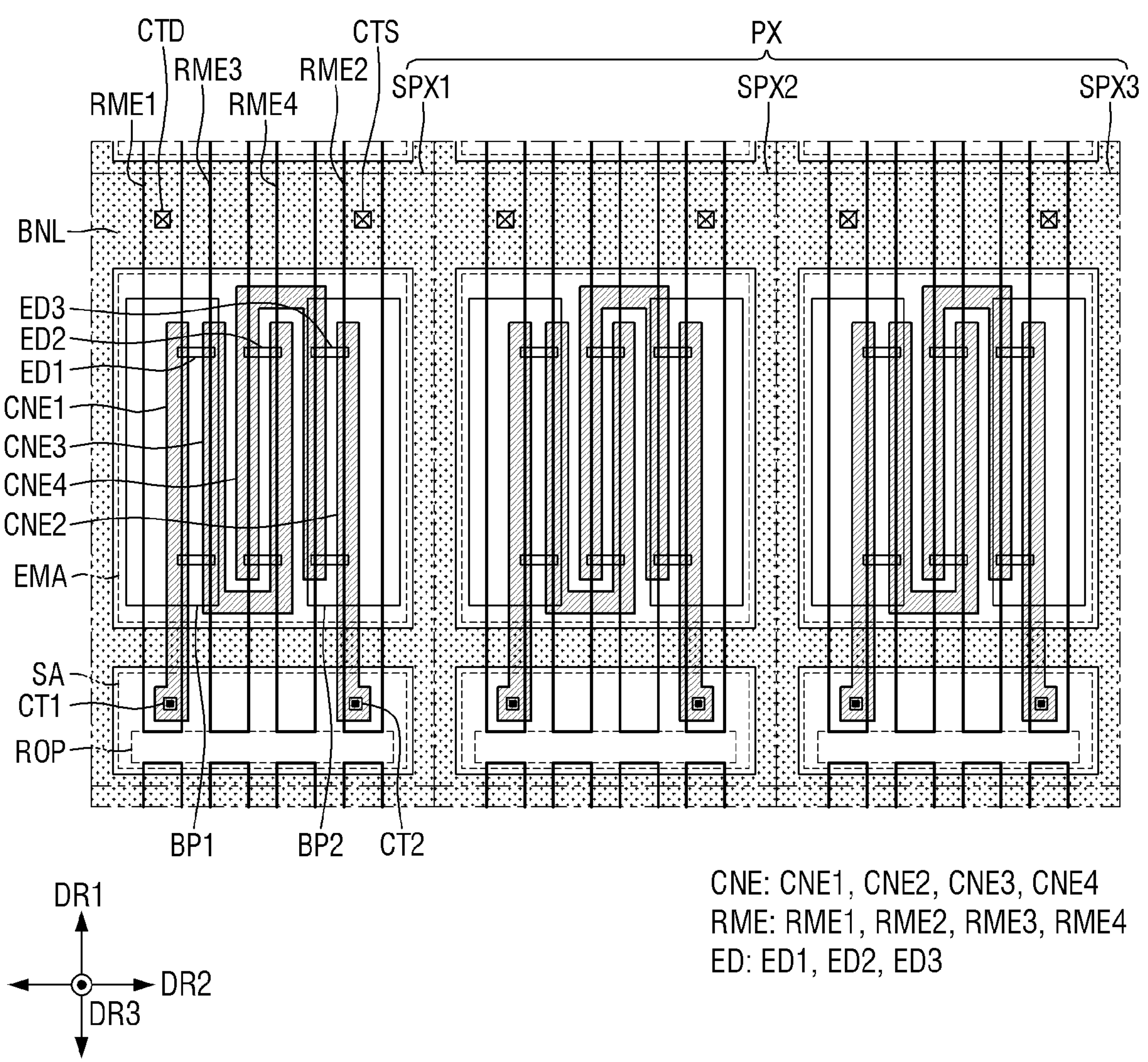
FIG. 2 is a schematic plan view illustrating one pixel of a display device according to one embodiment.
Figure 3:
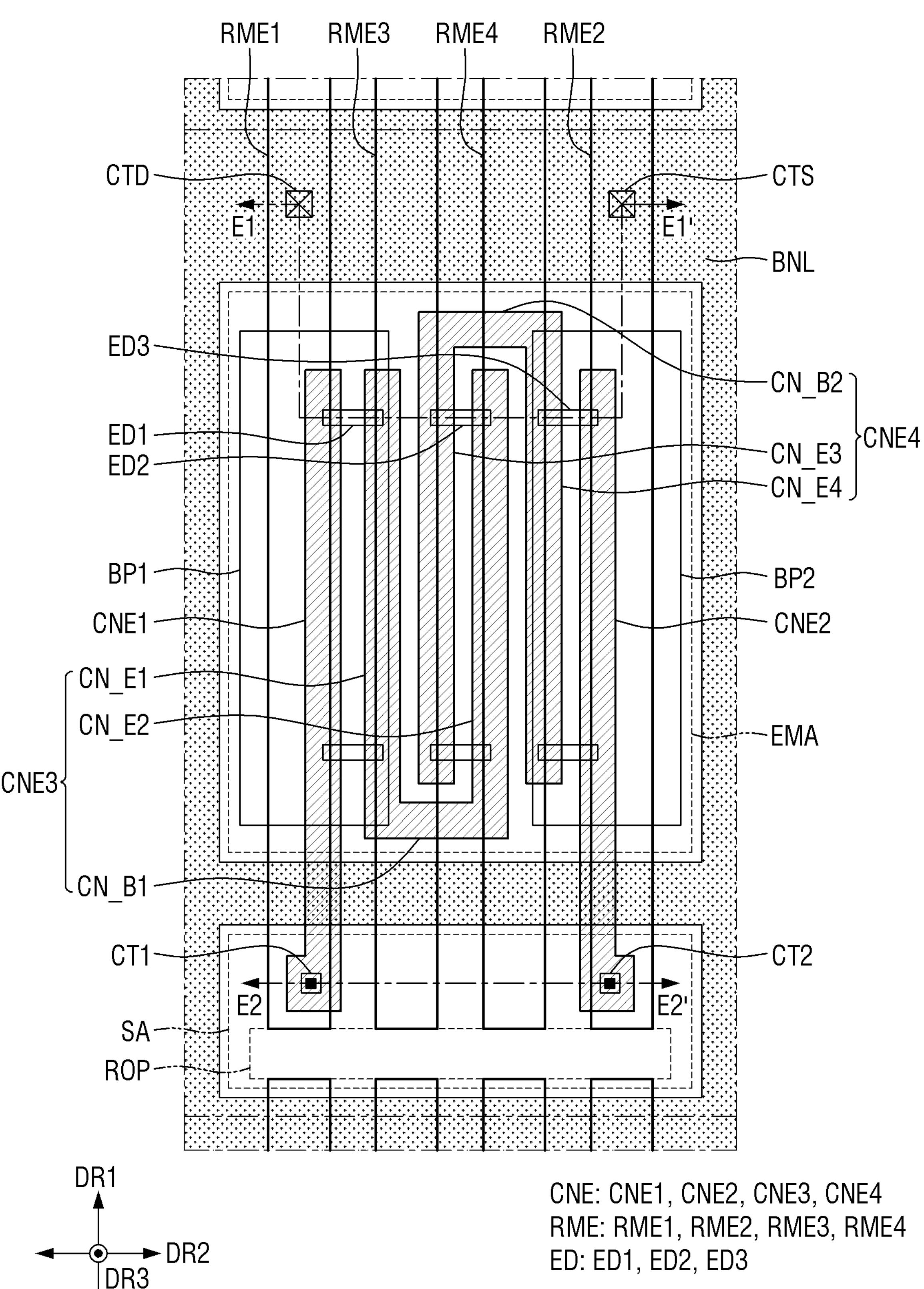
FIG. 3 is a schematic plan view illustrating one subpixel of a display device according to one embodiment.

FIG. 2 is a schematic plan view illustrating a pixel of a display device according to an embodiment. FIG. 3 is a schematic plan view illustrating a subpixel of a display device according to an embodiment.

FIG. 2 illustrates a planar arrangement of electrodes RME (RME1, RME2, RME3, RME4), bank patterns BP1 and BP2, a bank layer BNL, light emitting elements ED (ED1, ED2, ED3), and connection electrode CNE (CNE1, CNE2, CNE3, CNE4), which are disposed in a pixel PX of the display device 10.

Referring to FIGS. 2 and 3, each of the pixels PX of the display device 10 may include subpixels SPXn (where n is a natural number). For example, a pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be red, the second color may be green, and the third color may be blue, but the disclosure is not limited thereto. The respective subpixels SPXn may emit light of the same color. In an embodiment, each subpixel SPXn may emit blue light. Although a pixel PX includes three subpixels SPXn, it is not limited thereto, and the pixel PX may include a larger number of subpixels SPXn.

Each subpixel SPXn of the display device 10 may include a light emission area EMA and a non-light emission area. The light emission area EMA may be an area in which a light emitting element ED is disposed to emit light of a specific wavelength band. The non-light emission area may be an area where the light emitting element ED is not disposed and light emitted from the light emitting element ED does not reach there so that the light is not emitted.

The light emission area EMA may include an area in which the light emitting element ED is disposed, and an area in which the light emitted from the light emitting element ED is emitted to an area adjacent to the light emitting element ED. For example, the light emission area EMA may also include an area where the light emitted from the light emitting element ED is reflected or refracted by another member and emitted. The light emitting elements ED may be disposed in the respective subpixels SPXn, and may include an area in which the subpixels are disposed and an area adjacent to the above area to form the light emission area.

FIG. 2 illustrates that the light emission areas EMA of the respective subpixels SPXn have a uniform size, but the disclosure is not limited thereto. In some embodiments, each light emission area EMA of each subpixel SPXn may have a size different from that of another light emission area depending on the color or wavelength band of the light emitted from the light emitting element ED disposed in the corresponding subpixel SPXn.

Each subpixel SPXn may further include a sub-area SA disposed in the non-emission area. The sub-area SA of the corresponding subpixel SPXn may be disposed at a lower side that is another side of the light emission area EMA in a first direction DR1. The light emission area EMA and the sub-area SA may be alternately disposed in the first direction DR1, and the sub-area SA may be disposed between light emission areas EMA of different subpixels SPXn spaced apart from each other in the first direction DR1. For example, the light emission area EMA and the sub-area SA may be alternately disposed in the first direction DR1, and may be repeatedly disposed in a second direction DR2, but the disclosure is limited thereto. The light emission areas EMA and the sub-areas SA in the pixels PX may have an arrangement different from that of FIG. 2.

As the light emitting element ED is not disposed in the sub-area SA, light is not emitted from the sub-area SA, but a portion of the electrodes RME disposed in the respective subpixels SPXn may be disposed in the sub-area SA. The electrodes RME disposed in different subpixels SPXn may be spaced apart from each other by a partition portion ROP of the sub-area SA.

The display device 10 may include electrodes RME (RME1, RME2, RME3, RME4), bank patterns BP1 and BP2, a bank layer BNL, light emitting elements ED (ED1, ED2, ED3), and connection electrodes CNE (CNE1, CNE2, CNE3, CNE4).

The bank patterns BP1 and BP2 may be disposed in the light emission area EMA of each subpixel SPXn. The bank patterns BP1 and BP2 may have a width in the second direction DR2 and have a shape extended in the first direction DR1.

For example, the bank patterns BP1 and BP2 may include a first bank pattern BP1 and a second bank pattern BP2, which are spaced apart from each other in the second direction DR2 in the light emission area EMA of each subpixel SPXn. The first bank pattern BP1 may be disposed on a left side that is a side in the second direction DR2 at the center of the light emission area EMA, and the second bank patterns BP2 may be disposed on a right side that is another side in the second direction DR2 at the center of the light emission area EMA by being spaced apart from the first bank pattern BP1. The first bank pattern BP1 and the second bank pattern BP2 may be alternately disposed in the second direction DR2, and may be disposed in the display area DPA in an island shaped pattern. Light emitting elements ED may be disposed between the first bank pattern BP1 and the second bank pattern BP2.

The first bank pattern BP1 and the second bank pattern BP2 may be the same as each other in their lengths in the first direction DR1, and may be shorter than the light emission area EMA, which is surrounded by the bank layer BNL, in the first direction DR1. The first bank pattern BP1 and the second bank pattern BP2 may be spaced apart from a portion of the bank layer BNL, which is extended in the second direction DR2, but the disclosure is not limited thereto. The bank patterns BP1 and BP2 may be integral with the bank layer BNL, or may partially overlap the portion of the bank layer BNL, which is extended in the second direction DR2. The length of the bank patterns BP1 and BP2 in the first direction DR1 may be the same as or greater than that of the light emission area EMA, which is surrounded by the bank layer BNL, in the first direction DR1.

The first bank pattern BP1 and the second bank pattern BP2 in the second direction DR2 may be the same as each other in their widths in the second direction DR2, but the disclosure is not limited thereto. The first bank pattern BP1 and the second bank pattern BP2 may have their respective widths different from each other. For example, any one of the bank patterns may have a width greater than that of the other bank pattern, and the bank pattern having a greater width may be disposed over the light emission areas EMA of other subpixels SPXn adjacent to each other in the second direction DR2. The bank pattern disposed over the light emission areas EMA may overlap the portion of the bank layer BNL, which is extended in the first direction DR1, in a thickness direction. FIG. 2 illustrates that the two bank patterns BP1 and BP2 are disposed with the same width for each subpixel SPXn, but the disclosure is not limited thereto. The number and shape of the bank patterns BP1 and BP2 may vary depending on the number or arrangement structure of the electrodes RME.

The electrodes RME (RME1, RME2, RME3, RME4) are disposed for each subpixel SPXn in a shape extended in a direction. The electrodes RME1, RME2, RME3, and RME4 may be extended in the first direction DR1 and disposed in the light emission area EMA and the sub-area SA of the subpixel SPXn, and may be spaced apart from each other in the second direction DR2. The electrodes RME may be electrically connected to the light emitting element ED, which will be described below, but the disclosure is not limited thereto. The electrodes RME may not be electrically connected to the light emitting element ED.

The display device 10 may include a first electrode RME1, a second electrode RME2, a third electrode RME3, and a fourth electrode RME4, which are disposed in each subpixel SPXn. The first electrode RME1 is disposed on a left side at the center of the light emission area EMA, and the second electrode RME2 is spaced apart from the first electrode RME1 in the second direction DR2 and disposed on a right side at the center of the light emission area EMA.

The third electrode RME3 may be disposed between the first electrode RME1 and the second electrode RME2, and the fourth electrode RME4 may be disposed between the second electrode RME2 and the third electrode RME3. The electrodes RME may be disposed such that the first electrode RME1, the third electrode RME3, the fourth electrode RME4, and the second electrode RME2 are sequentially disposed from a left side to a right side of the subpixel SPXn.

Portions of the first electrode RME1 and the third electrode RME3 may be disposed on the first bank pattern BP1, and portions of the second electrode RME2 and the fourth electrode RME4 may be disposed on the second bank pattern BP2. The first electrode RME1, the second electrode RME2, the third electrode RME3, and the fourth electrode RME4 may be partially disposed in the corresponding subpixel SPXn and the sub-area SA via the bank layer BNL. The first electrode RME1, the second electrode RME2, the third electrode RME3, and the fourth electrode RME4 of their respective subpixels SPXn may be spaced apart from one another based on the partition portion ROP positioned in the sub-area SA of any one subpixel SPXn.

Among the electrodes RME, the first electrode RME1 and the second electrode RME2 may be connected to a third conductive layer therebelow through contact holes CTD and CTS. However, the third electrode RME3 and the fourth electrode RME4 are not directly connected to the third conductive layer therebelow, and may be electrically connected to the first electrode RME1 and the second electrode RME2 by the light emitting elements ED and the connection electrodes CNE. The first electrode RME1 and the second electrode RME2 are first type electrodes directly connected to the third conductive layer through the contact holes CTD and CTS, and the third electrode RME3 and the fourth electrode RME4 may be second type electrodes that are not directly connected to the third conductive layer. The second type electrodes may provide an electrical connection path of the light emitting elements ED together with the connection electrodes CNE.

FIG. 2 illustrates that the four electrodes RME have a shape extended in the first direction DR1 for each subpixel SPXn, but the disclosure is not limited thereto. For example, the display device 10 may include a smaller number of electrodes RME disposed in a subpixel SPXn, or a larger number of electrodes RME disposed in a subpixel SPXn. The electrodes RME may be partially bent, and may have a shape with a width that varies depending on the position.

The bank layer BNL may be disposed to surround the subpixels SPXn, the light emission area EMA, and the sub-area SA. The bank layer BNL may be disposed at a boundary between adjacent subpixels SPXn in the first direction DR1 and the second direction DR2, and may also be disposed at a boundary between the light emission area EMA and the sub-area SA. The subpixels SPXn, the light emission area EMA, and the sub-area SA of the display device 10 may be areas partitioned by the arrangement of the bank layer BNL. Intervals among the subpixels SPXn, the light emission areas EMA, and the sub-areas SA may vary depending on the width of the bank layer BNL.

The bank layer BNL may include portions extended in the first direction DR1 and the second direction DR2 in a plan view, and thus may be disposed on an entire surface of the display area DPA in a lattice pattern. The bank layer BNL may be disposed over a boundary of each of the subpixels SPXn to partition the subpixels SPXn adjacent to each other. The bank layer BNL may be disposed to surround the light emission area EMA and the sub-area SA, which are disposed for each subpixel SPXn, thereby partitioning them.

The light emitting elements ED may be disposed between the bank patterns BP1 and BP2 or on different electrodes RME. A portion of the light emitting elements ED may be disposed between the first bank pattern BP1 and the second bank pattern BP2, another portion thereof may be disposed on a side of the first bank pattern BP1, and another portion thereof may be disposed on a side of the second bank pattern BP2. According to an embodiment, the light emitting element ED may include a first light emitting element ED1 disposed on the side of the first bank pattern BP1, a second light emitting element ED2 disposed between the first bank pattern BP1 and the second bank pattern BP2, and a third light emitting element ED3 disposed on the side of the second bank pattern BP2. The first light emitting element ED1 may be disposed on the first electrode RME1 and the third electrode RME3, the second light emitting element ED2 may be disposed on the third electrode RME3 and the fourth electrode RME4, and the third light emitting element ED3 may be disposed on the fourth electrode RME4 and the second electrode RME2. In an embodiment, the first light emitting element ED1 may be disposed on the left side of the light emission area EMA of the corresponding subpixel SPXn, the second light emitting element ED2 may be disposed at the center of the light emission area EMA of the corresponding subpixel SPXn, and the third light emitting element ED3 may be disposed on the right side of the light emission area EMA of the corresponding subpixel SPXn. However, the respective light emitting elements ED may not be distinguished depending on their positions in the light emission area EMA but may be distinguished depending on a connection relation with the connection electrode CNE that will be described below. The respective light emitting elements ED may have their respective connection electrodes CNE, with which ends (or both ends) are in contact, depending on the arrangement structure of the connection electrodes CNE, and may be mutually distinguished depending on the types of the connection electrodes CNE that are in contact therewith.

The connection electrodes CNE (CNE1, CNE2, CNE3, CNE4) may be disposed on the electrodes RME and the bank patterns BP1 and BP2. Each of the connection electrodes CNE may have a shape extended in a direction, and may be disposed to be spaced apart from another connection electrode. The respective connection electrodes CNE may contact the light emitting elements ED, and may be electrically connected to the electrodes RME or the conductive layer therebelow.

The connection electrodes CNE may include a first connection electrode CNE1, a second connection electrode CNE2, a third connection electrode CNE3, and a fourth connection electrode CNE4, which are disposed in each subpixel SPXn. The first connection electrode CNE1 may have a shape extended in the first direction DR1, and may be disposed on the first electrode RME1 or the first bank pattern BP1. The first connection electrode CNE1 may partially overlap the first electrode RME1, and may be disposed from the light emission area EMA to the sub-area SA via the bank layer BNL. The second connection electrode CNE2 may have a shape extended in the first direction DR1, and may be disposed on the second electrode RME2 or the second bank pattern BP2. The second connection electrode CNE2 may partially overlap the second electrode RME2, and may be disposed from the light emission area EMA to the sub-area SA via the bank layer BNL.

The third connection electrode CNE3 may include a first extension portion CN_E1 disposed on the third electrode RME3, a second extension portion CN_E2 disposed on the fourth electrode RME4, and a first connection portion CN_B1 connecting the first extension portion CN_E1 with the second extension portion CN_E2. The first extension portion CN_E1 may be spaced apart from the first connection electrode CNE1 in the second direction DR2 to face the first connection electrode CNE1, and the second extension portion CN_E2 may be spaced apart from the third extension portion CN_E3 of the fourth connection electrode CNE4 in the second direction DR2. The first connection portion CN_B1 may be disposed over the third electrode RME3 and the fourth electrode RME4.

The fourth connection electrode CNE4 may include a third extension portion CN_E3 disposed on the third electrode RME3, a fourth extension portion CN_E4 disposed on the fourth electrode RME4, and a second connection portion CN_B2 connecting the third extension portion CN_E3 with the fourth extension portion CN_E4. The third extension portion CN_E3 may be spaced apart from the second extension portion CN_E2 of the third connection electrode CNE3 in the second direction DR2 to face the second extension portion CN_E2, and the fourth extension portion CN_E4 may be spaced apart from the second connection electrode CNE2 in the second direction DR2 to face the second connection electrode CNE2. The second connection portion CN_B2 may be disposed over the second electrode RME2 and the fourth electrode RME4.

The first connection electrode CNE1 and the second connection electrode CNE2 may be first type connection electrodes that contact the first electrode RME1 and the second electrode RME2, which are directly connected to the third conductive layer, and the third connection electrode CNE3 and the fourth connection electrode CNE4 may be second type connection electrodes that contact the third electrode RME3 and the fourth electrode RME4, which are not directly connected to the third conductive layer.

As described above, the light emitting elements ED may be divided into different light emitting elements depending on the connection electrode CNE which ends of the light emitting elements ED contact, in response to the arrangement structure of the connection electrodes CNE.

A first end of the first light emitting element ED1 and the third light emitting element ED2 may contact the first type connection electrode, and a second end thereof may contact the second type connection electrode. The first light emitting element ED1 may contact the first connection electrode CNE1 and the third connection electrode CNE3, and the third light emitting element ED3 may contact the second connection electrode CNE2 and the fourth connection electrode CNE4. A first end and a second end of the third light emitting element ED3 may contact the second type connection electrode. The third light emitting element ED3 may contact the third connection electrode CNE3 and the fourth connection electrode CNE4.

The light emitting elements ED may be connected to one another in series by the connection electrodes CNEs. The display device 10 according to the embodiment includes a larger number of light emitting elements ED for each subpixel SPXn and may constitute a series connection of the light emitting elements ED, and thus the amount of light emission per unit area may be more increased.

Figure 5:
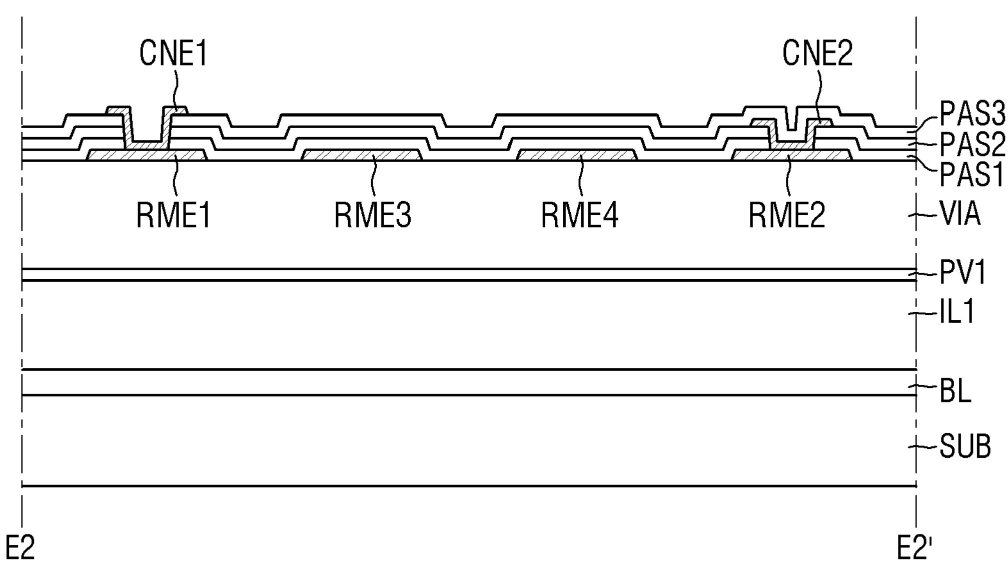
FIG. 5 is a schematic cross-sectional view taken along line E2-E2' of FIG. 3.
Figure 6:
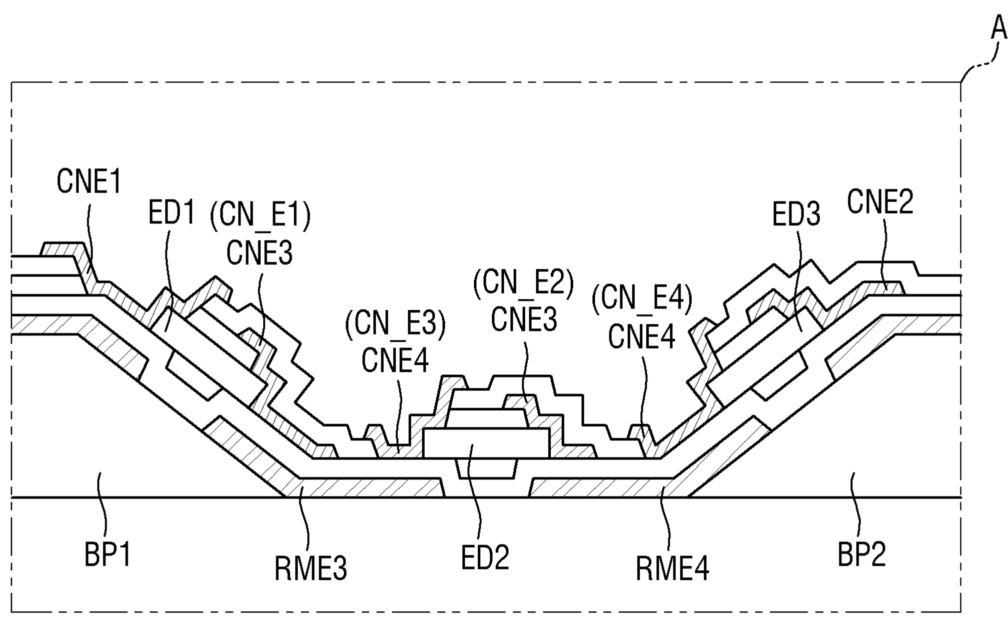
FIG. 6 is a schematic enlarged cross-sectional view illustrating area A of FIG. 4.

FIG. 4 is a schematic cross-sectional view taken along line E1-E1' of FIG. 3. FIG. 5 is a schematic cross-sectional view taken along line E2-E2' of FIG. 3. FIG. 6 is a schematic enlarged cross-sectional view illustrating area A of FIG. 4.

FIG. 4 illustrates a cross-section crossing ends (or both ends) of the light emitting element ED disposed in the first subpixel SPX1 and electrode contact holes CTD and CTS, and FIG. 5 illustrates a cross-section crossing contact portions CT1 and CT2 disposed in the first subpixel SPXn.

A sectional structure of the display device 10 will be described with reference to FIGS. 3 to 6. The display device 10 may include a substrate SUB, and a semiconductor layer, conductive layers, and insulating layers, which are disposed on the substrate. The display device 10 may include electrodes RME (RME1, RME2, RME3, RME4), light emitting elements ED (ED1, ED2, ED3), and connection electrodes CNE (CNE1, CNE2, CNE3, CNE4).

The substrate SUB may be an insulating substrate. The substrate SUB may be made of (or include) an insulating material such as glass, quartz, or polymer resin. The substrate SUB may be a rigid substrate, but may be a flexible substrate capable of being subjected to bending, folding, rolling or the like. The substrate SUB may include a display area DPA and a non-display area NDA surrounding the display area DPA, and the display area DPA may include a light emission area EMA and a sub-area SA that is a portion of a non-light emission area.

A first conductive layer may be disposed on the substrate SUB. The first conductive layer includes a lower metal layer BML that is disposed to overlap a first active layer ACT1 of a first transistor T1. The lower metal layer BML may prevent light from entering the first active layer ACT1 of the first transistor T1, or may be electrically connected to the first active layer ACT1 to stabilize electrical characteristics of the first transistor T1. However, the lower metal layer BML may be omitted.

A buffer layer BL may be disposed on the lower metal layer BML and the substrate SUB. The buffer layer BL may be formed on the substrate SUB to protect the transistors of the pixel PX from moisture permeated through the substrate SUB vulnerable to moisture permeation, and may perform a surface planarization function.

The semiconductor layer is disposed on the buffer layer BL. The semiconductor layer may include the first active layer ACT1 of the first transistor T1 and a second active layer ACT2 of a second transistor T2. Each of the first active layer ACT1 and the second active layer ACT2 may be disposed to partially overlap a first gate electrode G1 and a second gate electrode G2 of a second conductive layer, which will be described below.

The semiconductor layer may include polycrystalline silicon, monocrystalline silicon, an oxide semiconductor, and the like. In other embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although FIG. 4 illustrates that the first transistor T1 and the second transistor T2 are disposed in the subpixel SPXn of the display device 10, the disclosure is not limited thereto. The display device 10 may include a larger number of transistors.

A first gate insulating layer GI is disposed on the semiconductor layer in the display area DPA. The first gate insulating layer GI may serve as a gate insulating layer of each of the transistors T1 and T2. FIG. 4 illustrates that the first gate insulating layer GI is patterned along with the gate electrodes G1 and G2 of the second conductive layer, which will be described below, so that the first gate insulating layer GI is partially disposed between the second conductive layer and the active layers ACT1 and ACT2 of the semiconductor layer, but the disclosure is not limited thereto. In some embodiments, the first gate insulating layer GI may be disposed entirely on the buffer layer BL.

The second conductive layer is disposed on the first gate insulating layer GI. The second conductive layer may include a first gate electrode G1 of the first transistor T1 and a second gate electrode G2 of the second transistor T2. The first gate electrode G1 may be disposed to overlap a channel area of the first active layer ACT1 in a third direction DR3 that is a thickness direction, and the second gate electrode G2 may be disposed to overlap a channel area of the second active layer ACT2 in the third direction DR3 that is the thickness direction.

A first interlayer insulating layer IL1 is disposed on the second conductive layer. The first interlayer insulating layer IL1 may serve as an insulating layer between the second conductive layer and other layers disposed on the second conductive layer, and may protect the second conductive layer.

The third conductive layer is disposed on the first interlayer insulating layer ILL The third conductive layer may include a first voltage line VL1 and a second voltage line VL2, which are disposed in the display area DPA, a first conductive pattern CDP1, and source electrodes S1 and S2 and drain electrodes D1 and D2 of the respective transistors T1 and T2.

A high-potential voltage (or first power voltage) transferred to the first electrode RME1 may be applied to the first voltage line VL1, and a low-potential voltage (or second power voltage) transferred to the second electrode RME2 may be applied to the second voltage line VL2. A portion of the first voltage line VL1 may contact the first active layer ACT1 of the first transistor T1 through a contact hole that passes through the first interlayer insulating layer ILL The first voltage line VL1 may serve as a first drain electrode D1 of the first transistor T1. The second voltage line VL2 may be directly connected to the second electrode RME2 that will be described below.

The first conductive pattern CDP1 may contact the first active layer ACT1 of the first transistor T1 through the contact hole that passes through the first interlayer insulating layer ILL The first conductive pattern CDP1 may contact the lower metal layer BML, through another contact hole that passes through the first interlayer insulating layer IL1 and the buffer layer BL. The first conductive pattern CDP1 may serve as the first source electrode S1 of the first transistor T1. The first conductive pattern CDP1 may be connected to the first electrode RME1 or the first connection electrode CNE1, which will be described below. The first transistor T1 may transfer the first power voltage, applied from the first voltage line VL1, to the first electrode RME1 or the first connection electrode CNE1.

Each of the second source electrode S2 and the second drain electrode D2 may contact the second active layer ACT2 of the second transistor T2 through the contact hole that passes through the first interlayer insulating layer IL1.

A first passivation layer PV1 is disposed on the third conductive layer. The first passivation layer PV1 may serve as an insulating layer between the third conductive layer and other layers, and may protect the third conductive layer.

The buffer layer BL, the first gate insulating layer GI, the first interlayer insulating layer ILL and the first passivation layer PV1 may be formed as (or formed of) inorganic layers that are alternately stacked each other. For example, the buffer layer BL, the first gate insulating layer GI, the first interlayer insulating layer ILL and the first passivation layer PV1 may be formed as a double layer in which inorganic layers including at least one of silicon oxide ($SiO_x$), silicon nitride ($SiN_x$), and silicon oxynitride ($SiO_xN_y$) are stacked each other, or as multiple layers in which the inorganic layers are alternately stacked each other, but the disclosure is not limited thereto. The buffer layer BL, the first gate insulating layer GI, the first interlayer insulating layer ILL and the first passivation layer PV1 may be formed as an inorganic layer including the insulating material described above. In some embodiments, the first interlayer insulating layer IL1 may be made of an organic insulating material such as polyimide (PI).

A via layer VIA is disposed on the third conductive layer in the display area DPA. The via layer VIA may include an organic insulating material such as polyimide (PI) and form a flat upper surface by compensating for a step difference caused by the lower conductive layers. However, in some embodiments, the via layer VIA may be omitted.

The display device 10 may include bank patterns BP1 and BP2, electrodes RME (RME1, RME2, RME3, RME4), a bank layer BNL, light emitting elements ED (ED1, ED2, ED3), and connection electrodes CNE (CNE1, CNE2, CNE3, CNE4) as display element layers disposed on the via layer VIA. The display device 10 may include insulating layers PAS1, PAS2, and PASS, which are disposed on the via layer VIA.

The bank patterns BP1 and BP2 may be disposed on the via layer VIA. For example, the bank patterns BP1 and BP2 may be directly disposed on the via layer VIA, and may have a structure in which at least a portion thereof is protruded based on the upper surface of the via layer VIA. The protruded portions of the bank patterns BP1 and BP2 may have a side inclined or curved with a curvature, and light emitted from the light emitting element ED may be reflected by the electrodes RME disposed on the bank patterns BP1 and BP2 and then emitted in an upward direction of the via layer VIA. Unlike the shown example, an outer surface of the bank patterns BP1 and BP2 in a cross-sectional view may have a shape curved with a curvature, for example, a semi-circular or semi-elliptical shape. The bank patterns BP1 and BP2 may include, but are not limited to, an organic insulating material such as polyimide (PI).

The electrodes RME (RME1, RME2, RME3, RME4) may be disposed on the bank patterns BP1 and BP2 and the via layer VIA to overlap them. The first electrode RME1, the second electrode RME2, the third electrode RME3, and the fourth electrode RME4 may be disposed on the inclined sides of the bank patterns BP1 and BP2. For example, the first electrode RME1 and the third electrode RME3 may overlap the first bank pattern BP1. At least portions of the first electrode RME1 and the third electrode RME3 may be disposed on the inclined side of the first bank pattern BP1, and the other portion thereof may be disposed on the upper surface of the via layer VIA. The second electrode RME2 and the fourth electrode RME4 may overlap the second bank pattern BP2. At least portions of the second electrode RME2 and the fourth electrode RME4 may be disposed on the inclined side of the second bank pattern BP2, and the other portion thereof may be disposed on the upper surface of the via layer VIA.

A width of the electrodes RME, which is measured in the second direction DR2, may be smaller than that of the bank patterns BP1 and BP2, which is measured in the second direction DR2. An interval between the third electrode RME3 and the fourth electrode RME4, which are spaced apart from each other in the second direction DR2, may be smaller than that between the bank patterns BP1 and BP2. As at least portions of the first electrode RME1, the second electrode RME2, the third electrode RME3, and the fourth electrode RME4 may be disposed directly on the via layer VIA, the first to fourth electrodes RME1 to RME4 may be disposed on a same plane.

The light emitting elements ED disposed above or between the bank patterns BP1 and BP2 may emit light in end directions, and the emitted light may be oriented toward the electrode RME disposed on the bank patterns BP1 and BP2. Each electrode RME may have a structure in which a portion thereof disposed on the bank patterns BP1 and BP2 may reflect the light emitted from the light emitting element ED. The first electrode RME1, the second electrode RME2, the third electrode RME3, and the fourth electrode RME4 may be disposed to cover sides of the bank patterns BP1 and BP2 to reflect the light emitted from the light emitting element ED.

The first electrode RME1 and the second electrode RME2 of the electrodes RME may directly contact the third conductive layer through the electrode contact holes CTD and CTS in portions of the first electrode RME1 and the second electrode RME2 overlapped with (or overlapping) the bank layer BNL between the light emission area EMA and the sub-area SA. The first electrode contact hole CTD may be formed in an area where the bank layer BNL and the first electrode RME1 overlap each other, and the second electrode contact hole CTS may be formed in an area where the bank layer BNL and the second electrode RME2 overlap each other. The first electrode RME1 may contact the first conductive pattern CDP1 through the first electrode hole CTD that passes through the via layer VIA and the first passivation layer PV1. The second electrode RME2 may contact the second voltage line VL2 through the second electrode contact hole CTS that passes through the via layer VIA and the first passivation layer PV1. The first electrode RME1 may be electrically connected to the first transistor T1 through the first conductive pattern CDP1 to allow the first power voltage to be applied thereto, and the second electrode RME2 may be electrically connected to the second voltage line VL2 to allow the second power voltage to be applied thereto. The third electrode RME3 and the fourth electrode RME4 may not be electrically connected to the first and second voltage lines VL1 and VL2 of the third conductive layer.

The electrodes RME may include a conductive material having high reflectance. For example, the electrodes RME may include a metal such as silver (Ag), copper (Cu), or aluminum (Al) or an alloy containing aluminum (Al), nickel (Ni), lanthanum (La), etc., or may have a structure in which a metal layer such as titanium (Ti), molybdenum (Mo), or niobium (Nb) and the alloy are stacked each other. In some embodiments, the electrodes RME may be a double layer or multiple layers in which an alloy containing aluminum (Al) and at least one metal layer of titanium (Ti), molybdenum (Mo), or niobium (Nb) are stacked each other.

Without limitation to the above example, each of the electrodes RME may further include a transparent conductive material. For example, each electrode RME may include a material such as ITO, IZO, or ITZO. In some embodiments, each of the electrodes RME may have a structure in which one or more layers of a transparent conductive material and at least one metal layer having high reflectance are stacked each other, or may be formed as a single layer including the transparent conductive material and the metal layer. For example, each electrode RME may have a stacked structure such as ITO/Ag/ITO, ITO/Ag/IZO, or ITO/Ag/ITZO/IZO. The electrodes RME may be electrically connected to the light emitting elements ED, and may reflect a portion of the light emitted from the light emitting elements ED in an upward direction of the substrate SUB.

The first insulating layer PAS1 is disposed on the entire surface of the display area DPA, and may be disposed on the via layer VIA and the electrodes RME. The first insulating layer PAS1 may include an insulating material to protect the electrodes RME and insulate the different electrodes RME from each other. The first insulating layer PAS1 is disposed to cover the electrodes RME before the bank layer BNL is formed, thereby preventing the electrodes RME from being damaged in the process of forming the bank layer BNL. The first insulating layer PAS1 may prevent the light emitting element ED disposed thereon from being damaged due to direct contact with other members.

In an embodiment, the first insulating layer PAS1 may be stepped such that a portion of an upper surface thereof is recessed between the electrodes RME spaced apart from each other in the second direction DR2. The light emitting elements ED may be disposed on the upper surface of the first insulating layer PAS1 that is stepped, and a space may be formed between the light emitting elements ED and the first insulating layer PAS1. The space may be filled with the second insulating layer PAS2 that will be described below.

The first insulating layer PAS1 may include contact portions CT1 and CT2 disposed in the sub-area SA. The contact portions CT1 and CT2 may be disposed to overlap their respective electrodes different from each other. For example, the contact portions CT1 and CT2 may include a first contact portion CT1 disposed to overlap the first electrode RME1, and a second contact portion CT2 disposed to overlap the second electrode RME2. The first contact portion CT1 and the second contact portion CT2 may expose a portion of an upper surface of the first electrode RME1 or the second electrode RME2 therebelow by passing through the first insulating layer PAS1. Each of the first contact portion CT1 and the second contact portion CT2 may further pass through a portion of other insulating layers disposed on the first insulating layer PAS1. The first electrode RME1 and the second electrode RME2, which are exposed by the respective contact portions CT1 and CT2, may contact the connection electrodes CNE.

The bank layer BNL may be disposed on the first insulating layer PAS1. The bank layer BNL includes portions extended in the first direction DR1 and the second direction DR2, and may surround each of the subpixels SPXn. The bank layer BNL may distinguish the light emission area EMA from the sub-area SA while surrounding the light emission area EMA and the sub-area SA of each subpixel SPXn, and may distinguish the display area DPA from the non-display area NDA while surrounding the outermost periphery of the display area DPA.

The bank layer BNL may have a height, similar to the bank patterns BP1 and BP2. In some embodiments, an upper surface of the bank layer BNL may be higher than the bank patterns BP1 and BP2, and its thickness may be equal to or greater than that of the bank patterns BP1 and BP2. The bank layer BNL may prevent ink from overflowing into the subpixel SPXn adjacent thereto in an inkjet printing process of a process of manufacturing the display device 10. The bank layer BNL may include an organic insulating material such as polyimide in the same manner as the bank patterns BP1 and BP2.

The light emitting elements ED may be disposed in the light emission area EMA. The light emitting elements ED may include a first light emitting element ED1 disposed on the first electrode RME1 and the third electrode RME3, a second light emitting element ED2 disposed on the third electrode RME3 and the fourth electrode RME4, and a third light emitting element ED3 disposed on the fourth electrode RME4 and the second electrode RME2.

The light emitting elements ED may be disposed on the first insulating layer PAS1 above or between the bank patterns BP1 and BP2. For example, the first light emitting elements ED1 may be disposed on the first bank pattern BP1 to overlap the first bank pattern BP1, and may be disposed to be parallel with (or parallel to) the inclined side of the first bank pattern BP1. The second light emitting elements ED2 may be disposed between the first bank pattern BP1 and the second bank pattern BP2, and may not overlap the first and second bank patterns BP1 and BP2. The second light emitting elements ED2 may be disposed to be parallel with the upper surface of the substrate SUB or the via layer VIA. The third light emitting elements ED3 may be disposed on the second bank pattern BP2 to overlap the second bank pattern BP2, and may be disposed to be parallel with the inclined side of the second bank pattern BP2. The side of the first bank pattern BP1 on which the first light emitting elements ED1 are disposed and the side surface of the second bank pattern BP2 on which the third light emitting elements ED3 are disposed may face each other.

The light emitting elements ED may be disposed such that a length direction in which the light emitting elements ED are extended is disposed to be parallel with a surface of the via layer VIA or surfaces of the bank patterns BP1 and BP2. For example, the light emitting elements ED may be disposed such that a length direction of the first light emitting elements ED1 is disposed to be parallel with the side of the first bank pattern BP1, a length direction of the second light emitting elements ED2 is disposed to be parallel with the upper surface of the via layer VIA, and a length direction of the third light emitting elements ED3 is disposed to be parallel with the side of the second bank pattern BP2.

As described above, the light emitting elements ED may be disposed on the upper surface of the via layer VIA and may be disposed on the sides of the bank patterns BP1 and BP2. Light may be emitted from the second light emitting elements ED2 that overlap the upper surface of the via layer VIA, and light may be emitted from each of the first light emitting elements ED1 that overlap the side of the first bank pattern BP1 and the third light emitting elements ED3 that overlap the side of the second bank pattern BP2. Therefore, a light emission area in which light is emitted from a subpixel SPXn may be increased. The light emitting elements ED are aligned even on the sides of the bank patterns BP1 and BP2 as well as an upper portion of the via layer VIA, and thus the light emitting elements ED may be prevented from being aggregated during the alignment of the light emitting elements ED. Therefore, a light emitting defect caused by a contact failure of the connection electrodes CNE to the light emitting elements ED may be reduced, whereby display quality may be improved.

As described below, the light emitting elements ED may include semiconductor layers disposed in the extended direction. The semiconductor layers of the second light emitting elements ED2 may be sequentially disposed in a direction parallel with the upper surface of the via layer VIA. The semiconductor layers of the first light emitting elements ED1 may be sequentially disposed in a direction parallel with the side of the first bank pattern BP1, and the semiconductor layers of the third light emitting elements ED3 may be sequentially disposed in a direction parallel with the side of the second bank pattern BP2. However, the semiconductor layers are not limited to the above examples. In case that each of the light emitting elements ED has another structure, the semiconductor layers may be disposed in a direction perpendicular to the via layer VIA or the sides of the bank patterns BP1 and BP2.

The light emitting elements ED disposed in the respective subpixels SPXn may emit light having different wavelength bands depending on the material of the semiconductor layer, but the disclosure is not limited thereto. The light emitting elements ED disposed in the respective subpixels SPXn may include semiconductor layers of a same material to emit light of a same color. The light emitting elements ED may contact the connection electrodes CNE (CNE1, CNE2, CNE3, CNE4) and thus electrically connected to the conductive layers below the electrodes RME and the via layer VIA, and may emit light of a specific wavelength band as an electrical signal is applied thereto.

The second insulating layer PAS2 may be disposed on the light emitting elements ED, the first insulating layer PAS1, and the bank layer BNL. The second insulating layer PAS2 includes a pattern portion extended in the first direction DR1 between the bank patterns BP1 and BP2 and disposed on the light emitting elements ED. The pattern portion is disposed to partially surround an outer surface of the light emitting element ED, and may not cover sides (or both sides) or ends (or both ends) of the light emitting element ED. The pattern portion may form a linear or island-shaped pattern within each subpixel SPXn in a plan view. The pattern portion of the second insulating layer PAS2 may protect the light emitting elements ED and fix the light emitting elements ED in the manufacturing process of the display device 10. The second insulating layer PAS2 may be disposed to fill a space between the light emitting element ED and the second insulating layer PAS2 below the light emitting element ED. For example, the second insulating layer PAS2 may be formed to completely cover the light emitting elements ED, and may be patterned to expose ends of the light emitting elements ED. A portion of the second insulating layer PAS2 may fill a space between the light emitting elements ED and the first insulating layer PAS1 below the light emitting elements ED. Further, a portion of the second insulating layer PAS2 may be disposed on the bank layer BNL and in the sub-areas SA.

The second insulating layer PAS2 may include contact portions CT1 and CT2 disposed in the sub-area SA. The second insulating layer PAS2 may include a first contact portion CT1 disposed to overlap the first electrode RME1, and a second contact portion CT2 disposed to overlap the second electrode RME2. The contact portions CT1 and CT2 may also pass through the first insulating layer PAS1 and the second insulating layer PAS2. Each of the first and second contact portions CT1 and CT2 may expose a portion of an upper surface of the first electrode RME1 or the second electrode RME2 therebelow.

The connection electrodes CNE (CNE1, CNE2, CNE3, CNE4) may be disposed on the electrodes RME and the bank patterns BP1 and BP2. The first connection electrode CNE1 may be disposed on the first electrode RME1 and the first bank pattern BP1. The first connection electrode CNE1 may be disposed from the light emission area EMA to the sub-area SA via the bank layer BNL while partially overlapping the first electrode RME1. The second connection electrode CNE2 may be disposed on the second electrode RME2 and the second bank pattern BP2. The second connection electrode CNE2 may be disposed from the light emission area EMA to the sub-area SA via the bank layer BNL while partially overlapping the second electrode RME2.

The third connection electrode CNE3 may be disposed on the third electrode RME3, the fourth electrode RME4, the via layer VIA, and the first bank pattern BP1. The third connection electrode CNE3 may include a first extension portion CN_E1, a second extension portion CN_E2, and a first connection portion CN_B1. The first extension portion CN_E1 of the third connection electrode CNE3 may be adjacent to the first connection electrode CNE1, and may disposed in parallel with the first connection electrode CNE1. The first extension portion CN_E1 may be disposed on the third electrode RME3 and the first bank pattern BP1 to overlap them. The second extension portion CN_E2 of the third connection electrode CNE3 may be adjacent to the second connection electrode CNE2, and may be disposed in parallel with the second connection electrode CNE2. The second extension portion CN_E2 of the third connection electrode CNE3 may be disposed on the fourth electrode RME4 and the via layer VIA to overlap them. The first connection portion CN_B1 of the third connection electrode CNE3 may connect the first extension portion CN_E1 with the second extension portion CN_E2, and may be extended in the second direction DR2. The third connection electrode CNE3 may partially overlap the third electrode RME3 and the fourth electrode RME4, and may be disposed in the light emission area EMA.

The fourth connection electrode CNE4 may be disposed on the third electrode RME3, the fourth electrode RME4, the via layer VIA, and the second bank pattern BP2. The fourth connection electrode CNE4 may include a third extension portion CN_E3, a fourth extension portion CN_E4, and a second connection portion CN_B2. The third extension portion CN_E3 of the fourth connection electrode CNE4 may be adjacent to the first connection electrode CNE1, and may be disposed in parallel with the first connection electrode CNE1. The third extension CN_E3 of the fourth connection electrode CNE4 may be disposed on the third electrode RME3 and the via layer VIA to overlap them. The fourth extension portion CN_E4 of the fourth connection electrode CNE4 may be adjacent to the second connection electrode CNE2, and may be disposed in parallel with the second connection electrode CNE2. The fourth extension portion CN_E4 of the fourth connection electrode CNE4 may be disposed on the fourth electrode RME4 and the second bank pattern BP2 to overlap them. The second connection portion CN_B2 of the fourth connection electrode CNE4 may connect the third extension portion CN_E3 with the fourth extension portion CN_E4, and may be extended in the second direction DR2. The fourth connection electrode CNE4 may partially overlap the third electrode RME3 and the fourth electrode RME4, and may be disposed in the light emission area EMA. The third connection electrode CNE3 and the fourth connection electrode CNE4 do not overlap the bank layer BNL, and are not disposed in the sub-area SA.

The first connection electrode CNE1, the second connection electrode CNE2, the third connection electrode CNE3, and the fourth connection electrode CNE4 may be disposed on the second insulating layer PAS2, and may contact the light emitting elements ED. The first connection electrode CNE1 may partially overlap the first electrode RME1, and may contact first ends of the first light emitting elements ED1. The second connection electrode CNE2 may partially overlap the second electrode RME2, and may contact first ends of the third light emitting elements ED3. The first extension portion CN_E1 of the third connection electrode CNE3 may contact second ends of the first light emitting elements ED1, and the second extension portion CN_E2 thereof may contact first ends of the second light emitting elements ED2. The third extension portion CN_E3 of the fourth connection electrode CNE4 may contact second ends of the second light emitting elements ED2, and the fourth extension portion CN_E4 thereof may contact second ends of the third light emitting elements ED3.

The first connection electrode CNE1 and the second connection electrode CNE2 are disposed over the light emission area EMA and the sub-area SA. The first connection electrode CNE1 and the second connection electrode CNE2 contact the light emitting elements ED1 and ED3 in portions thereof disposed in the light emission area EMA, and may be electrically connected to the third conductive layer in portions thereof disposed in the sub-area SA. The third connection electrode CNE3 and the fourth connection electrode CNE4 are disposed only in the light emission area EMA, and may contact the light emitting elements ED1, ED2, and ED3.

According to an embodiment, in the display device 10, the first connection electrode CNE1 and the second connection electrode CNE2 may contact the first electrode RME1 and the second electrode RME2 through the contact portions CT1 and CT2 disposed in the sub-area SA. The first connection electrode CNE1 may contact the first electrode RME1 in the sub-area SA by the first contact portion CT1 that passes through the first insulating layer PAS1, the second insulating layer PAS2, and the third insulating layer PAS3. The second connection electrode CNE2 may contact the second electrode RME2 in the sub-area SA by the second contact portion CT2 that passes through the first insulating layer PAS1 and the second insulating layer PAS2.

The first connection electrode CNE1 and the second connection electrode CNE2 may be electrically connected to the third conductive layer by the first electrode RME1 and the second electrode RME2. The first connection electrode CNE1 may be electrically connected to the first transistor T1 to allow the first power voltage to be applied thereto, and the second connection electrode CNE2 may be electrically connected to the second voltage line VL2 to allow the second power voltage to be applied thereto. The first connection electrode CNE1 and the second connection electrode CNE2 may contact the light emitting elements ED in the light emission area EMA to transfer the power voltage to the light emitting elements ED. The third connection electrode CNE3 and the fourth connection electrode CNE4 are not connected to the electrodes RME, and may electrically connect the power source by the first and second connection electrodes CNE1 and CNE2 and the light emitting elements ED.

The connection electrodes CNE may include a conductive material. For example, the connection electrodes CNE may include ITO, IZO, ITZO, Al, etc. For example, the connection electrodes CNE include a transparent conductive material, and light emitted from the light emitting elements ED may be emitted by transmitting the connection electrodes CNE.

The third insulating layer PAS3 is disposed on the second connection electrode CNE2, the third connection electrode CNE3, and the second insulating layer PAS2. The third insulating layer PAS3 may be disposed entirely on the second insulating layer PAS2 to cover the second connection electrode CNE2 and the third connection electrode CNE3, and the first connection electrode CNE1 and the fourth connection electrode CNE4 may be disposed on the third insulating layer PAS3. The third insulating layer PAS3 may insulate the first connection electrode CNE1 and the fourth connection electrode CNE4 from each other such that the first connection electrode CNE1 and the fourth connection electrode CNE4 do not directly contact the second connection electrode CNE2 and the third connection electrode CNE3.

The third insulating layer PAS3 may include the first contact portions CT1 disposed in the sub-area SA. The first contact portions CT1 may also pass through the first insulating layer PAS1, the second insulating layer PAS2, and the third insulating layer PAS3. The first contact portions CT1 may expose a portion of the upper surface of the first electrode RME1 therebelow.

Although not shown in the drawing, another insulating layer may be further disposed on the third insulating layer PAS3, the first connection electrode CNE1, and the fourth connection electrode CNE4. The insulating layer may serve to protect the members disposed on the substrate SUB from an external environment.

Each of the first insulating layer PAS1, the second insulating layer PAS2, and the third insulating layer PAS3 may include an inorganic insulating material or an organic insulating material. For example, each of the first insulating layer PAS1, the second insulating layer PAS2, and the third insulating layer PAS3 may include an inorganic insulating material, or the first insulating layer PAS1 and the third insulating layer PAS3 may include an inorganic insulating material, but the second insulating layer PAS2 may include an organic insulating material. Each or at least one of the first insulating layer PAS1, the second insulating layer PAS2, and the third insulating layer PAS3 may be formed in a structure in which insulating layers are alternately or repeatedly stacked each other. In an embodiment, each of the first insulating layer PAS1, the second insulating layer PAS2, and the third insulating layer PAS3 may be any one of silicon oxide ($SiO_x$), silicon nitride ($SiN_x$) and silicon oxynitride ($SiO_xN_y$). The first insulating layer PAS1, the second insulating layer PAS2, and the third insulating layer PAS3 may be made of a same material, or portions of the first insulating layer PAS1, the second insulating layer PAS2, and the third insulating layer PAS3 may be made of a same material and portions thereof may be made of different materials, or all of the first to third insulating layers PAS1, PAS2, and PAS3 may be made of their respective materials different from one another.

Figure 7:
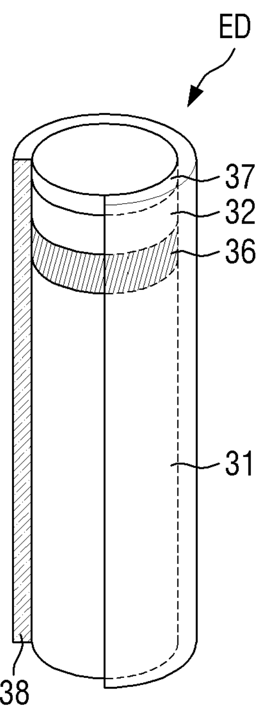
FIG. 7 is a schematic view illustrating a light emitting element according to one embodiment.

FIG. 7 is a schematic view illustrating a light emitting element according to an embodiment.

Referring to FIG. 7, the light emitting element ED may be a light emitting diode, and specifically, the light emitting element ED may be an inorganic light emitting diode made of an inorganic material with a size of a nano-meter to a micro-meter. The light emitting element ED may be aligned between two electrodes having polarities in case that an electric field is formed in a specific direction between the two electrodes facing each other.

The light emitting element ED according to an embodiment may have a shape extended in a direction. The light emitting element ED may have a cylindrical shape, a rod shape, a wire shape, or a tube shape, but the shape of the light emitting element ED is not limited thereto. The light emitting element ED may have a polygonal pillar shape such as a cube, a cuboid, and a hexagonal pillar, or may have various shapes such as a shape extended in a direction, and having an external surface that is partially inclined.

The light emitting element ED may include a semiconductor layer doped with any conductivity type (e.g., p-type or n-type) impurities. The semiconductor layer may emit light of a specific wavelength band as an electrical signal applied from an external power source is transferred thereto. The light emitting element ED may include a first semiconductor layer 31, a second semiconductor layer 32, a light emitting layer 36, an electrode layer 37, and an insulating layer 38.

The first semiconductor layer 31 may be an n-type semiconductor. The first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 31 may be any one or more of AlGaInN, GaN, AlGaN, InGaN, AlN, and InN, which are doped with n-type dopants. The n-type dopants doped in the first semiconductor layer 31 may be S1, Ge, Sn, etc.

The second semiconductor layer 32 is disposed on the first semiconductor layer 31 with the light emitting layer 36 interposed therebetween. The second semiconductor layer 32 may be a p-type semiconductor, and may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 32 may be any one or more of AlGaInN, GaN, AlGaN, InGaN, AlN, and InN, which are doped with p-type dopants. The p-type dopants doped in the second semiconductor layer 32 may be Mg, Zn, Ca, Ba, etc.

FIG. 7 illustrates that the first semiconductor layer 31 and the second semiconductor layer 32 are formed as a single layer, but the disclosure is not limited thereto. The first semiconductor layer 31 and the second semiconductor layer 32 may further include a larger number of layers such as a clad layer or a tensile strain barrier reducing (TSBR) layer, depending on the material of the light emitting layer 36. For example, the light emitting element ED may further include another semiconductor layer disposed between the first semiconductor layer 31 and the light emitting layer 36, or between the second semiconductor layer 32 and the light emitting layer 36. The semiconductor layer disposed between the first semiconductor layer 31 and the light emitting layer 36 may be any one or more of AlGaInN, GaN, AlGaN, InGaN, AlN, InN, and SLs doped with n-type dopants. The semiconductor layer disposed between the second semiconductor layer 32 and the light emitting layer 36 may be one or more of AlGaInN, GaN, AlGaN, InGaN, AlN, and InN doped with p-type dopants.

The light emitting layer 36 is disposed between the first semiconductor layer 31 and the second semiconductor layer 32. The light emitting layer 36 may include a material of a single or multiple quantum well structure. In case that the light emitting layer 36 includes a material of a multiple quantum well structure, quantum layers and well layers may be alternately stacked each other. The light emitting layer 36 may emit light by combination of electron-hole pairs due to electrical signals applied through the first semiconductor layer 31 and the second semiconductor layer 32. The light emitting layer 36 may include a material such as AlGaN, AlGaInN, and InGaN. Particularly, in case that the light emitting layer 36 has a multiple quantum well structure in which quantum layers and well layers are alternately stacked each other, the quantum layer may include a material such as AlGaN or AlGaInN, and the well layer may include a material such as GaN or AlInN.

The light emitting layer 36 may have a structure in which a semiconductor material having a big band gap energy and semiconductor materials having a small band gap energy are alternately stacked each other, and may include group III to V semiconductor materials depending on a wavelength band of light that is emitted. The light emitting layer 36 may emit light of a red or green wavelength band, as the case may be, without being limited to light of a blue wavelength band.

The electrode layer 37 may be an ohmic connection electrode, but is not limited thereto. The electrode layer 37 may be a Schottky connection electrode. The light emitting element ED may include at least one electrode layer 37. The light emitting element ED includes one or more electrode layers 37, but the disclosure is not limited thereto. The electrode layer 37 may be omitted.

The electrode layer 37 may reduce resistance between the light emitting element ED and an electrode or a connection electrode in case that the light emitting element ED is electrically connected with the electrode or the connection electrode in the display device 10. The electrode layer 37 may include a metal having conductivity. For example, the electrode layer 37 may include at least one of Al, T1, In, Au, Ag, ITO, IZO, and ITZO.

The insulating layer 38 is disposed to surround outer surfaces of the semiconductor layers and electrode layers. For example, the insulating layer 38 may be disposed to surround at least an outer surface of the light emitting layer 36, and may be formed to expose ends of the light emitting element ED in a length direction. The insulating layer 38 may have a rounded upper surface in a cross-sectional view in an area adjacent to at least one end of the light emitting element ED.

The insulating layer 38 may include materials having an insulation property, for example, at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). FIG. 7 illustrates that the insulating layer 38 is formed as a single layer, but the disclosure is not limited thereto. In some embodiments, the insulating layer 38 may have a multi-layered structure in which multiple layers are stacked each other.

The insulating layer 38 may serve to protect the semiconductor layers and the electrode layers of the light emitting element ED. The insulating layer 38 may prevent an electrical short that may occur in the light emitting layer 36 in case that the light emitting element ED directly contacts the electrode to which the electrical signal is transferred. The insulating layer 38 may prevent light emission efficiency of the light emitting element ED from being deteriorated.

An outer surface of the insulating layer 38 may be surface-treated. The light emitting element ED may be aligned by being sprayed onto the electrode in a state that it is dispersed in an ink. The surface of the insulating layer 38 may be hydrophobically or hydrophilically treated, so that the light emitting element ED may be maintained to be dispersed in the ink without being condensed (or aggregated) with another light emitting element ED adjacent thereto.

Figure 8:
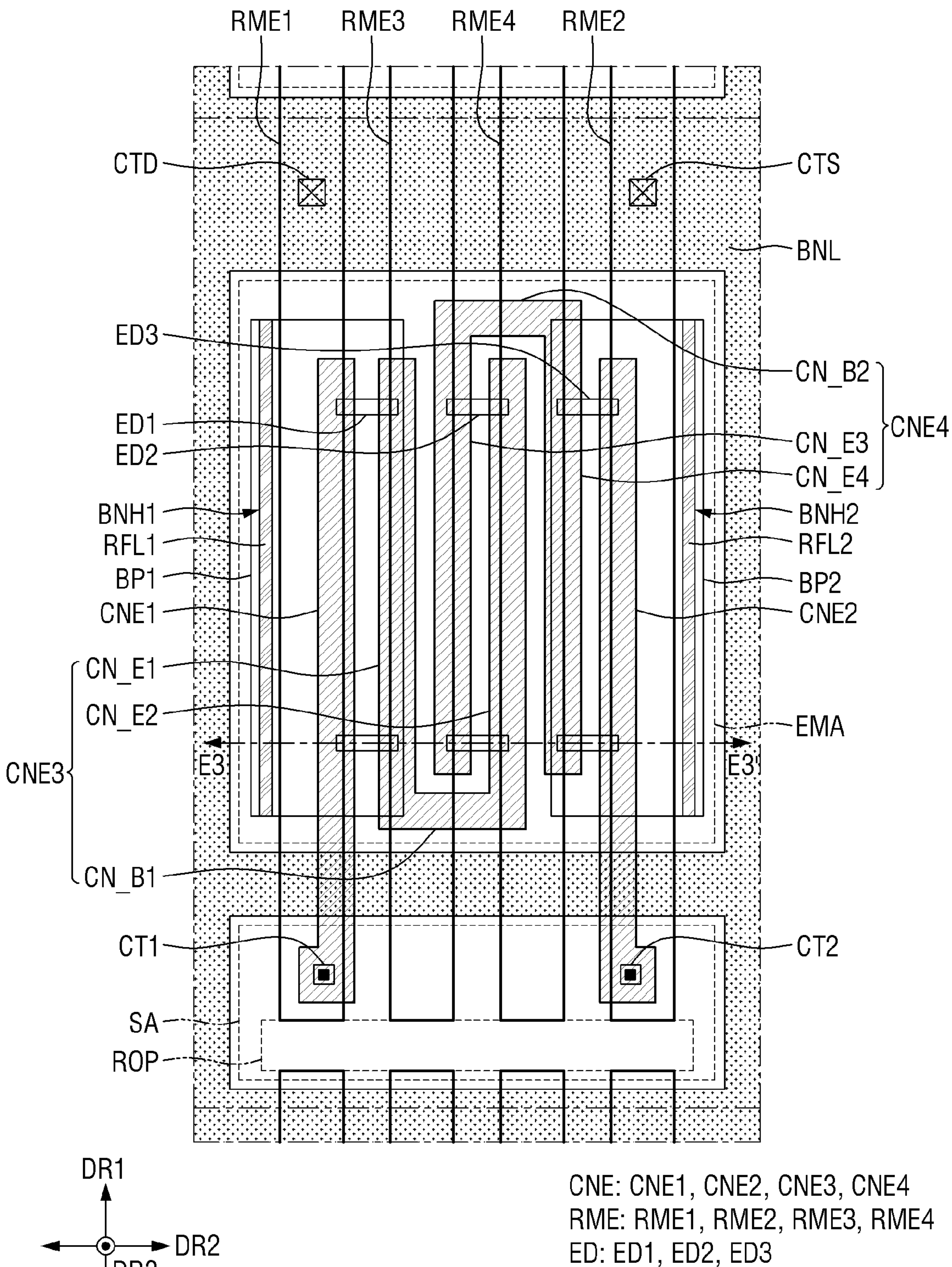
FIG. 8 is a schematic plan view illustrating one subpixel of a display device according to another embodiment.
Figure 9:
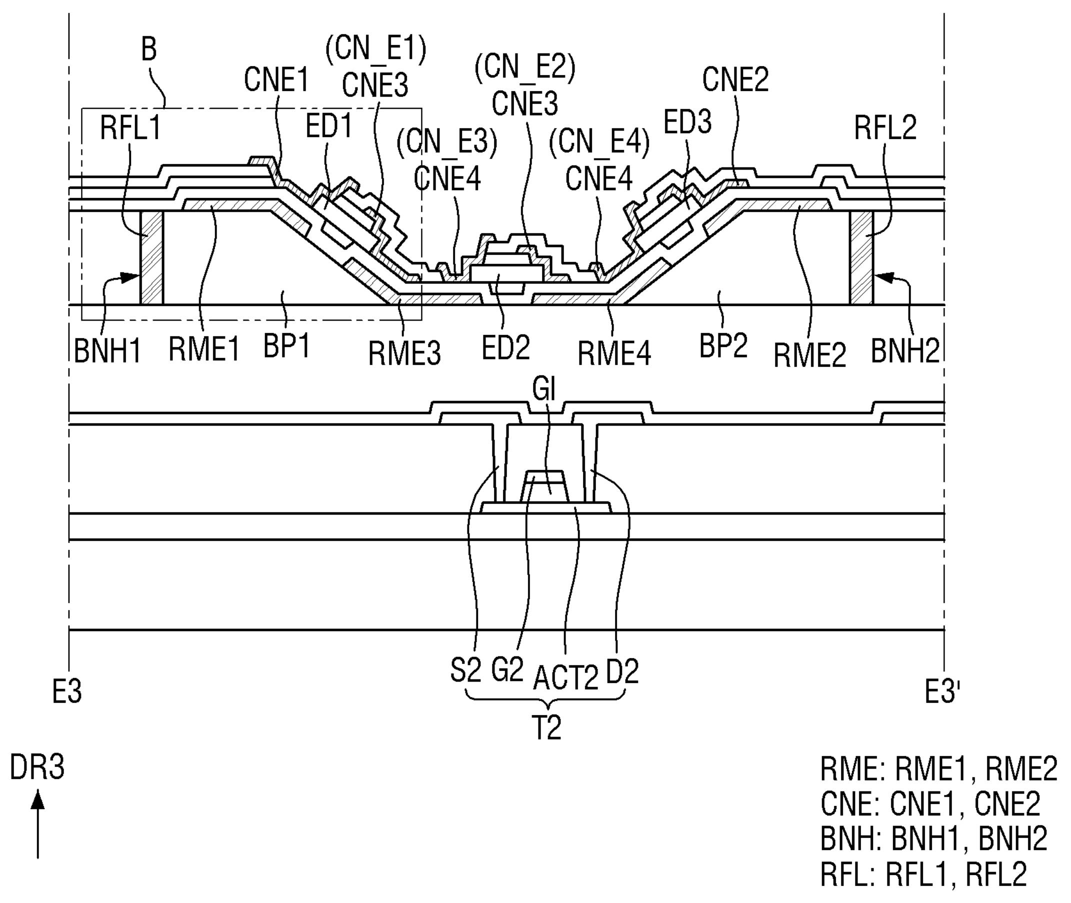
FIG. 9 is a schematic cross-sectional view taken along line E3-E3' of FIG. 8.
Figure 10:
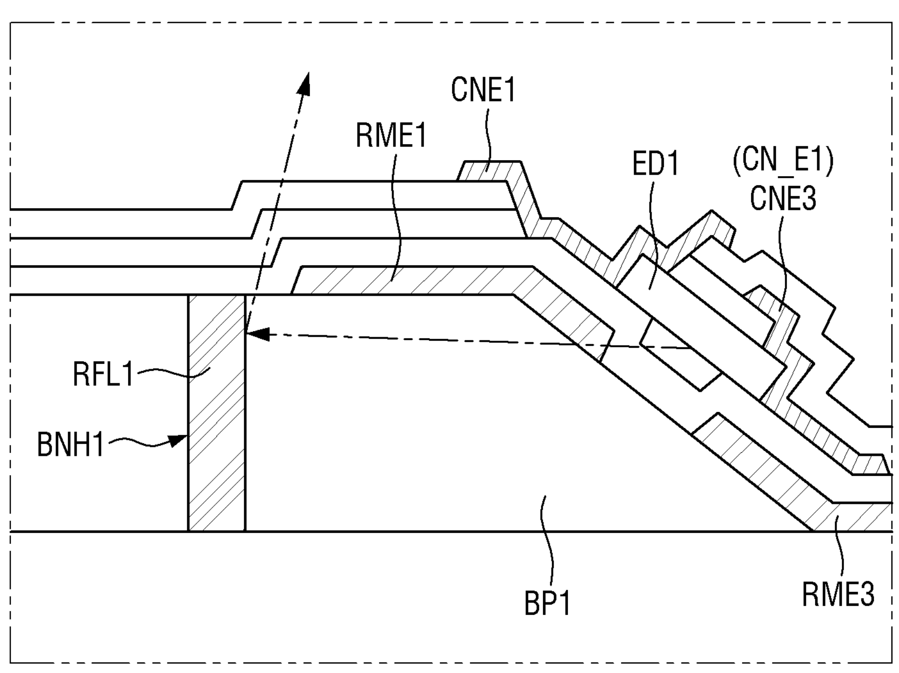
FIG. 10 is a schematic enlarged view illustrating area B of FIG. 9.
Figure 11:
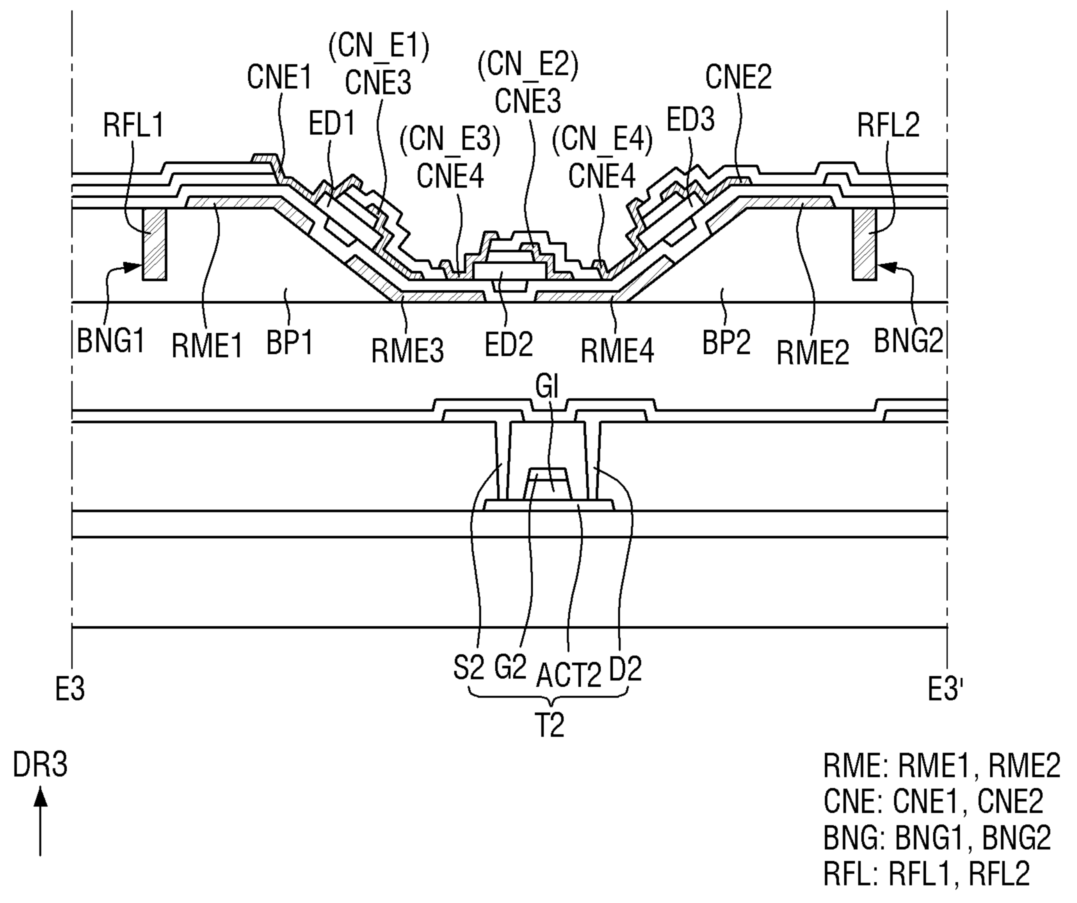
FIG. 11 is a schematic cross-sectional view illustrating another example taken along line E3-E3' of FIG. 8.

FIG. 8 is a schematic plan view illustrating a subpixel of a display device according to another embodiment. FIG. 9 is a schematic cross-sectional view taken along line E3-E3' of FIG. 8. FIG. 10 is a schematic enlarged view illustrating area B of FIG. 9. FIG. 11 is a schematic cross-sectional view illustrating another example taken along line E3-E3' of FIG. 8.

Referring to FIGS. 8 to 11, the embodiment is different from the embodiment of FIGS. 2 to 6 at least in that reflective layers RFL are further disposed in the bank patterns BP1 and BP2. Hereinafter, the repeated description with the above-described embodiments will be omitted, and a difference from the above-described embodiments will be described.

Referring to FIGS. 8 to 10, the bank patterns BP1 and BP2 may include bank holes BNH that pass through the bank patterns BP1 and BP2. The bank holes BNH may expose the upper surface of the via layer VIA disposed below the bank patterns BP1 and BP2 by passing through the bank patterns BP1 and BP2. The bank holes BNH may be disposed in the first bank pattern BP1 and the second bank pattern BP2. The bank holes BNH may include a first bank hole BNH1 disposed in the first bank pattern BP1 and a second bank hole BNH2 disposed in the second bank pattern BP2. The bank holes BNH may be extended in the first direction DR1, and may be disposed in parallel with the electrodes RME. The bank holes BNH may be spaced apart from the electrodes RME in the second direction DR2.

For example, the first bank hole BNH1 may be spaced apart from the first electrode RME1 and the third electrode RME3 in the second direction DR2, and may not overlap the first electrode RME1 and the third electrode RME3. In an embodiment, the first bank hole BNH1 may be disposed at a left edge of the first bank pattern BP1. The second bank hole BNH2 may be spaced apart from the second electrode RME2 and the fourth electrode RME4 in the second direction DR2, and may not overlap the second electrode RME2 and the fourth electrode RME4. In an embodiment, the second bank hole BNH2 may be disposed at a right edge of the second bank pattern BP2.

The reflective layers RFL may be disposed on the via layer VIA, and may be disposed inside the bank holes BNH of the bank patterns BP1 and BP2. For example, the reflective layers RFL may fill the inside of the bank holes BNH, and may directly contact the upper surface of the via layer VIA. The reflective layers RFL may include a first reflective layer RFL1 disposed in the first bank hole BNH1 of the first bank pattern BP1 and a second reflective layer RFL2 disposed in the second bank hole BNH2 of the second bank pattern BP2.

The reflective layers RFL may be extended in the first direction DR1, and may be disposed in parallel with the electrodes RME. The reflective layers RFL may be spaced apart from the electrodes RME in the second direction DR2. For example, the first reflective layer RFL1 may be spaced apart from the first electrode RME1 and the third electrode RME3 in the second direction DR2, and may not overlap the first electrode RME1 and the third electrode RME3. In an embodiment, the first reflective layer RFL1 may be disposed at the left edge of the first bank pattern BP1. The second reflective layer RFL2 may be spaced apart from the second electrode RME2 and the fourth electrode RME4 in the second direction DR2, and may not overlap the second electrode RME2 and the fourth electrode RME4. In an embodiment, the second reflective layer RFL2 may be disposed at the right edge of the second bank pattern BP2.

The reflective layers RFL may include a conductive material having a high reflectance. For example, the reflective layers RFL may include a metal such as silver (Ag), copper (Cu), or aluminum (Al) or an alloy containing aluminum (Al), nickel (Ni), lanthanum (La), etc., or may have a stacked structure in which a metal layer such as titanium (Ti), molybdenum (Mo), or niobium (Nb) and the alloy are stacked each other. In some embodiments, the reflective layers RFL may be formed as a double layer or multiple layers in which an alloy containing aluminum (Al) and at least one metal layer of titanium (Ti), molybdenum (Mo), or niobium (Nb) are stacked each other. The reflective layers RFL and the electrodes RME described above may include a same material, and the reflective layers RFL and the electrodes RME may be formed simultaneously.

The reflective layers RFL described above may reflect light emitted from the light emitting elements ED respectively disposed on the sides of the bank patterns BP1 and BP2. For example, the light emitted from the first light emitting element ED1 may be incident upon the first bank pattern BP1. The incident light may be reflected by the first reflective layer RFL1 and emitted to an upper portion of the first bank pattern BP1. The light emitted to the upper portion of the first bank pattern BP1 may increase luminance of the subpixels SPXn in addition to the light directly emitted from the light emitting elements ED to the upper portion.

Referring to FIG. 11, according to another embodiment, the bank patterns BP1 and BP2 may include a bank groove BNG partially recessed in a thickness direction.

The bank patterns BP1 and BP2 may include bank grooves BNG that are recessed from the upper surfaces of the bank patterns BP1 and BP2 in the third direction DR3 that is the thickness direction. The bank grooves BNG may be disposed in the first bank pattern BP1 and the second bank pattern BP2. The bank grooves BNG may include a first bank groove BNG1 disposed in the first bank pattern BP1 and a second bank groove BNG2 disposed in the second bank pattern BP2. The bank grooves BNG may be extended in the first direction DR1, and may be disposed in parallel with the electrodes RME. The bank holes BNH may be spaced apart from the electrodes RME in the second direction DR2.

For example, the first bank groove BNG1 may be spaced apart from the first electrode RME1 and the third electrode RME3 in the second direction DR2, and may not overlap the first electrode RME1 and the third electrode RME3. In an embodiment, the first bank groove BNG1 may be disposed at the left edge of the first bank pattern BP1. The second bank groove BNG2 may be spaced apart from the second electrode RME2 and the fourth electrode RME4 in the second direction DR2, and may not overlap the second electrode RME2 and the fourth electrode RME4. In an embodiment, the second bank groove BNG2 may be disposed at the right edge of the second bank pattern BP2. The bank grooves BNG and the bank holes BNH described above may have a same planar arrangement.

The bank grooves BNG may be disposed at a depth from the upper surfaces of the bank patterns BP1 and BP2. The depth of the bank grooves BNG may be less than the thickness of the bank patterns BP1 and BP2. For example, the depth of the first bank groove BNG1 may be less than the thickness of the first bank pattern BP1, and the depth of the second bank groove BNG2 may be less than the thickness of the second bank pattern BP2. The depth of the bank grooves BNG may be sufficiently deep so that the upper surface of the via layer VIA disposed below the bank patterns BP1 and BP2 may not be exposed.

The reflective layers RFL may be disposed on the via layer VIA, and may be disposed inside the bank grooves BNG of the bank patterns BP1 and BP2. For example, the reflective layers RFL may fill the inside of the bank grooves BNG, and may directly contact the upper surface of the via layer VIA. The reflective layers RFL may include a first reflective layer RFL1 disposed in the first bank groove BNG1 of the first bank pattern BP1 and a second reflective layer RFL2 disposed in the second bank groove BNG2 of the second bank pattern BP2. The planar arrangement of the reflective layers RFL may be the same as that shown in FIG. 8.

The reflective layers RFL disposed in the bank grooves BNG may reflect light emitted from the light emitting elements ED disposed on the sides of the bank patterns BP1 and BP2, respectively. For example, the light emitted from the first light emitting element ED1 may be incident upon the first bank pattern BP1. The incident light may be reflected by the first reflective layer RFL1 and emitted to the upper portion of the first bank pattern BP1. The light emitted to the upper portion of the first bank pattern BP1 may increase luminance of the subpixels SPXn in addition to the light directly emitted from the light emitting elements ED to the upper portion.

Figure 12:
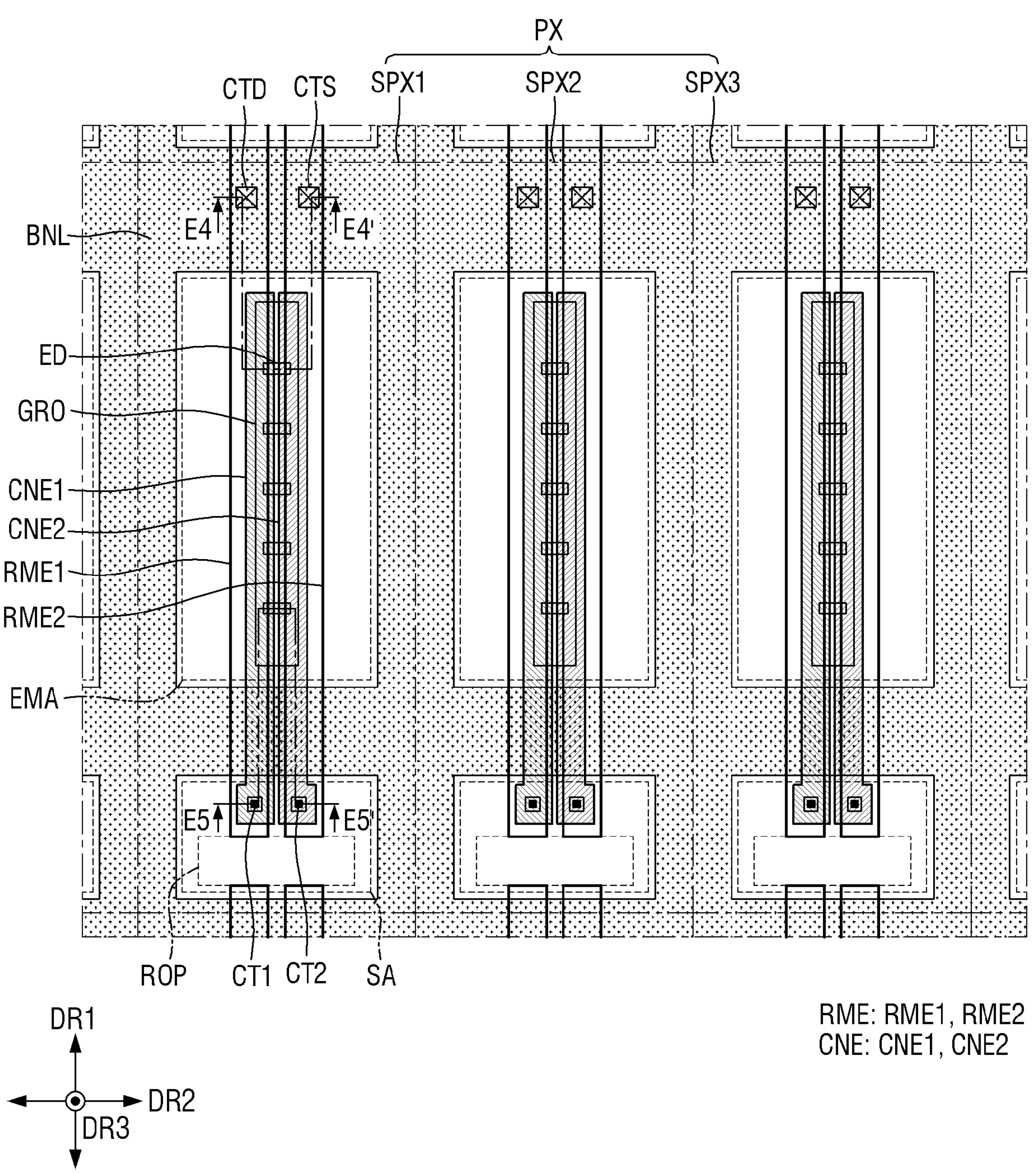
FIG. 12 is a schematic plan view illustrating one subpixel of a display device according to still another embodiment.
Figure 13:
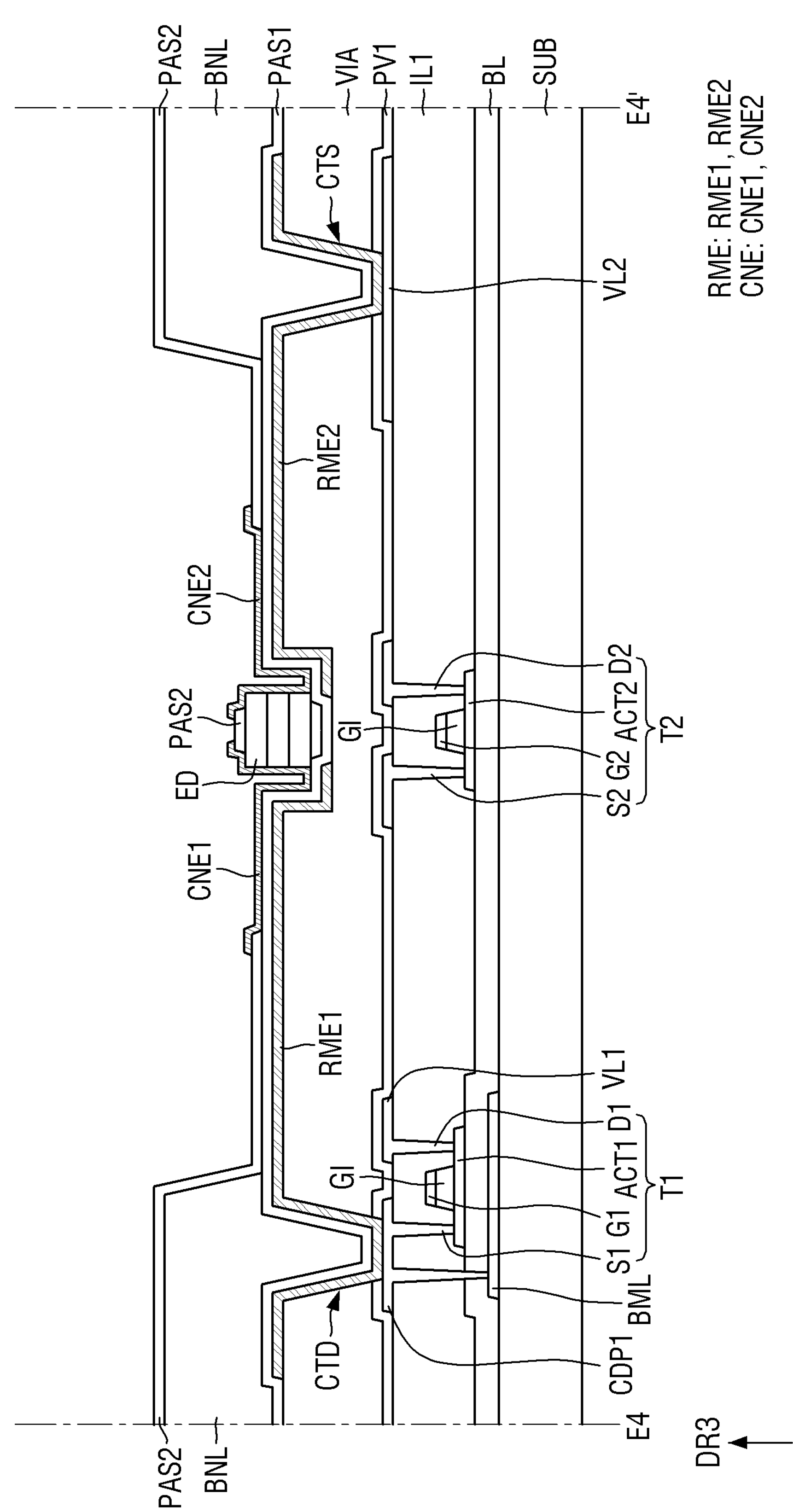
FIG. 13 is a schematic cross-sectional view taken along line E4-E4' of FIG. 12.
Figure 14:
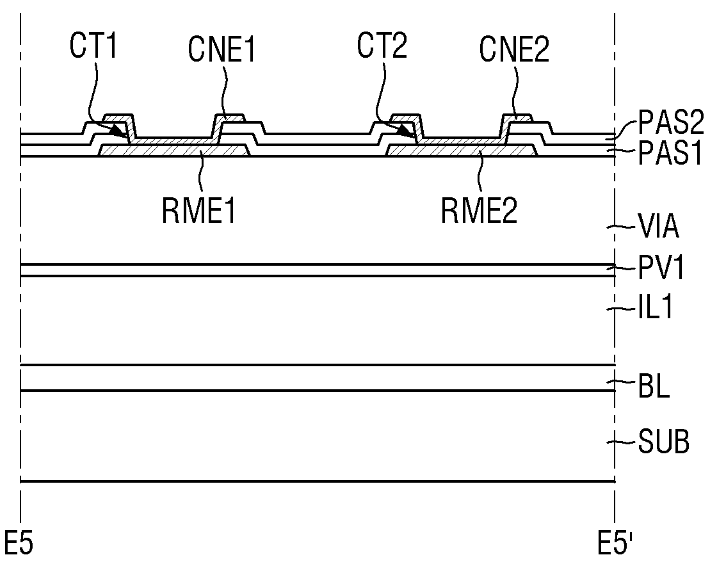
FIG. 14 is a schematic cross-sectional view taken along line E5-E5' of FIG. 12.
Figure 15:
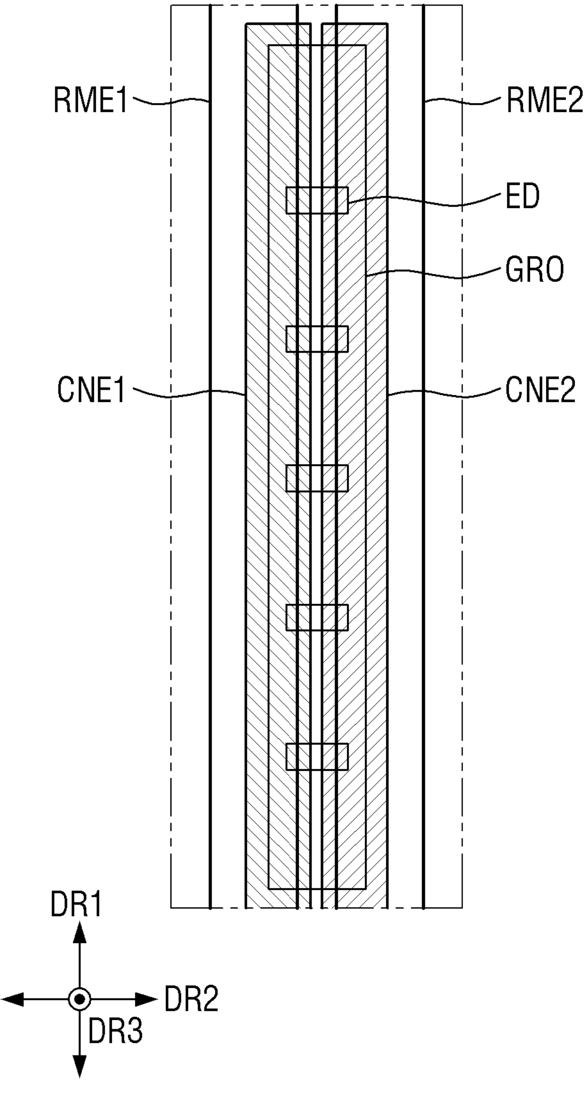
FIG. 15 is a schematic plan view illustrating a via groove of one subpixel of a display device according to still another embodiment.

FIG. 12 is a schematic plan view illustrating a subpixel of a display device according to still another embodiment. FIG. 13 is a schematic cross-sectional view taken along line E4-E4' of FIG. 12. FIG. 14 is a schematic cross-sectional view taken along line E5-E5' of FIG. 12. FIG. 15 is a schematic plan view illustrating a via groove of a subpixel of a display device according to still another embodiment.

Referring to FIGS. 12 to 15, the embodiment is different from the embodiment of FIG. 11 at least in that a via groove GRO is disposed in the via layer VIA and the light emitting elements ED are disposed in the via groove GRO. Hereinafter, the repeated description with the above-described embodiments will be omitted, and a difference from the above-described embodiments will be described.

Referring to FIG. 12, the display device 10 may include electrodes RME (RME1, RME2), a bank layer BNL, light emitting elements ED and connection electrodes CNE (CNE1, CNE2).

The electrodes RME (RME1, RME2) are disposed in each subpixel SPXn in a shape extended in a direction. The electrodes RME1 and RME2 may be extended in the first direction DR1 and disposed in the light emission area EMA and the sub-area SA of the subpixel SPXn, and may be spaced apart from each other in the second direction DR2. The electrodes RME may be electrically connected to the light emitting element ED, but the disclosure is not limited thereto. The electrodes RME may not be electrically connected to the light emitting element ED.

The display device 10 may include a first electrode RME1 and a second electrode RME2, which are disposed in each subpixel SPXn. The first electrode RME1 is disposed on a left side at the center of the light emission area EMA, and the second electrode RME2 is disposed on a right side at the center of the light emission area EMA by being spaced apart from the first electrode RME1 in the second direction DR2. The first and second electrodes RME1 and RME2 of different subpixels SPXn may be spaced apart from each other based on the partition portion ROP positioned in the sub-area SA of any one of the subpixels SPXn.

The bank layer BNL may be disposed over the entire surface of the display area DPA, and may expose or surround a portion of the subpixels SPXn. For example, the bank layer BNL may distinguish the light emission area EMA and the sub-area SA of the subpixel SPXn from each other.

The light emitting elements ED may be disposed in the light emission area EMA. The light emitting elements ED may be disposed to be spaced apart from each other in the first direction DR1. In an embodiment, the light emitting elements ED may have a shape extended in a direction, and their ends thereof may be disposed on their respective electrodes different from each other. For example, a first end of the light emitting element ED may be disposed on the first electrode RME1 and a second end thereof may be disposed on the second electrode RME2.

The connection electrodes CNE may be disposed on the light emitting elements ED and the bank layer BNL. The connection electrodes CNE may have a shape extended in a direction, and may be disposed to be spaced apart from each other. Each connection electrode CNE may contact the light emitting element ED, and may be electrically connected to the electrodes RME.

The connection electrodes CNE may include a first connection electrode CNE1 and a second connection electrode CNE2, which are disposed in each subpixel SPXn. The first connection electrode CNE1 may have a shape extended in the first direction DR1, and may be disposed on the first electrode RME1. The first connection electrode CNE1 may partially overlap the first electrode RME1, and may be disposed from the light emission area EMA to the sub-area SA. The second connection electrode CNE2 may have a shape extended in the first direction DR1, and may be disposed on the second electrode RME2. The second connection electrode CNE2 may partially overlap the second electrode RME2, and may be disposed from the light emission area EMA to the sub-area SA. The first connection electrode CNE1 may contact the first end of the light emitting elements, and the second connection electrode CNE2 may contact the second end of the light emitting elements ED.

Each connection electrode CNE may contact the electrode RME by contact portions CT1 and CT2 disposed in the sub-area SA. The first connection electrode CNE1 may contact the first electrode RME1 by the first contact portion CT1 in the sub-area SA. The second connection electrode CNE2 may contact the second electrode RME2 by the second contact portion CT2 in the sub-area SA. A power voltage may be applied to each of the connection electrodes CNE by the electrode RME. A first power voltage may be applied to the first connection electrode CNE1 by the first electrode RME1, and a second power voltage may be applied to the second connection electrode CNE2 by the second electrode RME2. Each connection electrode CNE may contact the light emitting element ED in the light emission area EMA to transfer the power voltage to the light emitting element ED.

Referring to FIGS. 12 and 13 to 15, the via layer VIA may be disposed on the third conductive layer in the display area DPA. The via layer VIA may include an organic insulating material such as polyimide (PI), to compensate for a step difference caused by the lower conductive layers and form a flat upper surface.

The via layer VIA may include a via groove GRO that is partially recessed in a thickness direction. The via groove GRO may be recessed in the thickness direction from the upper surface of the via layer VIA. The via groove GRO may be disposed at the center of the light emission area EMA, and may be extended in the first direction DR1. The via groove GRO may be disposed in each of the subpixels SPXn in an island-shaped pattern.

The via groove GRO may be extended in parallel with the electrodes RME, and may be also disposed in parallel with the connection electrodes CNE. The via groove GRO may be disposed to overlap the electrode RME, the connection electrodes CNE, and the light emitting element ED. For example, the first electrode RME1 and the second electrode RME2 may be adjacent to each other, and a portion where the first electrode RME1 and the second electrode RME2 face each other may overlap the via groove GRO. The light emitting elements ED may fully overlap the via groove GRO.

The via groove GRO may be disposed at a depth from the upper surface of the via layer VIA. The depth of the via groove GRO may be smaller than the thickness of the via layer VIA. The depth of the via groove GRO may be formed such that the upper surface of the first passivation layer PV1 disposed below the via layer VIA may not be exposed. In an embodiment, the depth of the via groove GRO may be greater than a diameter of the light emitting element ED, but the disclosure is not limited thereto. The depth of the via groove GRO may be smaller than the diameter of the light emitting element ED. The via groove GRO may have a width so that light emitting elements ED may be disposed therein. A width of the via groove GRO in the second direction DR2 is greater than the length of the light emitting element ED extended in the second direction DR2, so that the light emitting elements ED may be disposed in the via groove GRO.

The display device 10 may include electrodes RME (RME1, RME2), a bank layer BNL, a light emitting element ED, and connection electrodes CNE (CNE1, CNE2) as display element layers disposed on the via layer VIA. The display device 10 may include a first insulating layer PAS1 and a second insulating layer PAS2, which are disposed on the via layer VIA.

The electrodes RME may be disposed on the via layer VIA. For example, the electrodes RME may be disposed directly on the via layer VIA, and may be spaced apart from each other to face each other. The first electrode RME1 and the second electrode RME2 may overlap the bank layer BNL, respectively. The first and second electrodes RME1 and RME2 may be spaced apart from each other, and an interval therebetween may overlap the via groove GRO. In an embodiment, the interval between the first electrode RME1 and the second electrode RME2 may be smaller than the width of the via groove GRO of the via layer VIA. The via groove GRO has a width such that the light emitting element ED may be disposed, and the first electrode RME1 and the second electrode RME2 may be spaced apart from each other at an interval with which ends of the light emitting element ED may be placed.

At least portions of the first electrode RME1 and the second electrode RME2 may be disposed in the via groove GRO. The edges of the first and second electrodes RME1 and RME2 that are adjacent to each other and face each other may be extended into the via groove GRO. The first electrode RME1 and the second electrode RME2 may be spaced apart from each other on a bottom surface of the via groove GRO.

Each of the electrodes RME may directly contact the third conductive layer through electrode contact holes CTD and CTS in a portion of each electrode RME overlapped with the bank layer BNL between the light emission area EMA and the sub-area SA. The first electrode contact hole CTD may be formed in an area where the bank layer BNL and the first electrode RME1 overlap each other, and the second electrode contact hole CTS may be formed in an area where the bank layer BNL and the second electrode RME2 overlap each other. The first electrode RME1 may contact the first conductive pattern CDP1 through the first electrode contact hole CTD that passes through the via layer VIA and the first passivation layer PV1. The second electrode RME2 may contact the second conductive pattern CDP2 through the second electrode contact hole CTS that passes through the via layer VIA and the first passivation layer PV1. The first electrode RME1 may be electrically connected to the first transistor T1 by the first conductive pattern CDP1 to allow the first power voltage to be applied thereto, and the second electrode RME2 may be electrically connected to the second voltage line VL2 by the second conductive pattern CDP2 to allow the second power voltage to be applied thereto.

The first insulating layer PAS1 may be disposed entirely on the display area DPA, and may be disposed on the via layer VIA and the electrodes RME. The first insulating layer PAS1 may be disposed below the light emitting element ED to cover the electrodes RME. In an embodiment, the first insulating layer PAS1 may be stepped such that a portion of the upper surface thereof is recessed between the electrodes RME spaced apart from each other in the second direction DR2. The stepped portion of the first insulating layer PAS1 may be disposed in the via groove GRO. The light emitting element ED may be disposed on the upper surface of the first insulating layer PAS1 that is stepped, and a space may be formed between the light emitting element ED and the first insulating layer PAS1. The space may be filled with the second insulating layer PAS2 that will be described below.

The bank layer BNL may be disposed on the first insulating layer PAS1. The bank layer BNL may be disposed at a boundary of the light emission area EMA of the subpixel SPXn or a boundary of the subpixel SPXn. Since the bank layer BNL is the same as that described above, its description will be omitted.

The light emitting elements ED may be disposed in the light emission area EMA. The light emitting elements ED may be disposed in the via groove GRO. As described above, since the width of the via groove GRO is greater than the length of the light emitting elements ED, the light emitting elements ED may be disposed in the via groove GRO. In case that ink containing light emitting elements ED is sprayed onto the electrodes RME, the light emitting elements ED may be aligned between the electrodes RME by an electric field formed in the electrodes RME. For example, since the portion where the electric field is strongly formed between the electrodes RME corresponds to the via groove GRO, the via groove GRO may induce (or guide) the light emitting elements ED so that they may be gathered into the via groove GRO. In particular, the via groove GRO provides a space for allowing the light emitting elements ED to be aligned, and thus the light emitting elements ED may be aligned within a space of the via groove GRO to prevent the light emitting elements ED from being aggregated with each other.

Ends of the light emitting elements ED may be disposed on their respective electrodes RME different from each other. For example, a first end of the light emitting element ED may be disposed on the first electrode RME1, and a second end thereof may be disposed on the second electrode RME2. The length of the light emitting element ED is greater than the interval between the electrodes RME spaced apart from each other in the second direction DR2, and may be smaller than the width of the via groove GRO. The depth of the via groove GRO is greater than the diameter of the light emitting element ED, so that the light emitting elements ED disposed in the via groove GRO may be stacked each other in the thickness direction in case that ink containing a lot of light emitting elements ED is sprayed. In an embodiment, some light emitting elements ED stacked each other in the thickness direction may be protruded above the upper surface of the via layer VIA, but the disclosure is not limited thereto. The light emitting elements ED disposed in the via groove GRO may be disposed as a single layer.

The second insulating layer PAS2 may be partially disposed on the light emitting elements ED. A portion of the second insulating layer PAS2 may overlap the light emitting element ED and the via groove GRO. The second insulating layer PAS2 may be partially removed to expose ends of the light emitting element ED after being disposed to cover the light emitting element ED, the electrodes RME, and the first insulating layer PAS1 during the process of manufacturing the display device 10. A portion of the second insulating layer PAS2 may be disposed to fill the space between the light emitting elements ED and the first insulating layer PAS1 below the light emitting elements ED. The second insulating layer PAS2 may be extended in the first direction DR1 on the first insulating layer PAS1 in a plan view to form a linear or island-shaped pattern inside each subpixel SPXn.

The connection electrodes CNE may be disposed on the light emitting elements ED, the first insulating layer PAS1, the second insulating layer PAS2, and the bank layer BNL. The connection electrodes CNE may be disposed directly on the light emitting elements ED and electrically connected to the light emitting elements ED, and may fix the light emitting elements ED.

The connection electrodes CNE may include a first connection electrode CNE1 and a second connection electrode CNE2, which are disposed in each subpixel SPXn. The first connection electrode CNE1 may be directly disposed on the first insulating layer PAS1, the light emitting elements ED, and the second insulating layer PAS2 in the light emission area EMA and thus may contact the first end of the light emitting element ED. The first connection electrode CNE1 may be disposed from the light emission area EMA to the sub-area SA via the bank layer BNL. The first connection electrode CNE1 may contact the first electrode RME1 in the sub-area SA by the first contact portion CT1 that passes through the first insulating layer PAS1 and the second insulating layer PAS2.

The second connection electrode CNE2 may be directly disposed on the first insulating layer PAS1, the light emitting elements ED, and the second insulating layer PAS2 in the light emission area EMA, and thus may contact the second end of the light emitting elements ED. The second connection electrode CNE2 may be disposed from the light emission area EMA to the sub-area SA via the bank layer BNL. The second connection electrode CNE2 may contact the second electrode RME2 in the sub-area SA by the second contact portion CT2 that passes through the first insulating layer PAS1 and the second insulating layer PAS2.

The first connection electrode CNE1 and the second connection electrode CNE2 may be spaced apart from each other at an interval with which they may contact ends of the light emitting element ED. For example, the interval between the first connection electrode CNE1 and the second connection electrode CNE2 may be smaller than the length of the light emitting element ED. The interval between the first connection electrode CNE1 and the second connection electrode CNE2 may be smaller than the width of the via groove GRO.

In an embodiment, each of the connection electrodes CNE may be partially disposed in the via groove GRO. The first connection electrode CNE1 may be extended along the first end of the light emitting elements ED, and thus may directly contact the first insulating layer PAS1 disposed inside the via groove GRO. A portion of the first connection electrode CNE1 may be disposed between the first insulating layer PAS1 and the first end of the light emitting elements ED in the via groove GRO. The second connection electrode CNE2 may be extended along the second end of the light emitting elements ED, and thus may directly contact the first insulating layer PAS1 disposed inside the via groove GRO. A portion of the second connection electrode CNE2 may be disposed between the first insulating layer PAS1 and the second end of the light emitting elements ED in the via groove GRO.

The respective connection electrodes CNE may contact the first ends and the second ends of the light emitting elements ED stacked each other in the thickness direction.

For example, the first connection electrode CNE1 may be continuously disposed on and contact the first ends of the light emitting elements ED stacked each other in the thickness direction, and the second connection electrode CNE2 may be continuously disposed on and contact the second ends of the light emitting elements ED stacked each other in the thickness direction. As a result, the number of light emitting elements ED that may be electrically connected may be increased. As described above, as the light emitting elements ED are stacked each other in the thickness direction inside the via groove GRO, each of the connection electrodes CNE may directly contact the light emitting elements ED stacked each other in the thickness direction. For example, the number of light emitting elements ED connected to each connection electrode CNE is increased in a same area, and thus luminance may be improved remarkably.

The first connection electrode CNE1 may be electrically connected to the first transistor T1 to allow the first power voltage to be applied thereto, and the second connection electrode CNE2 may be electrically connected to the second voltage line VL2 to allow the second power voltage to be applied thereto. Each connection electrode CNE may contact the light emitting element ED in the light emission area EMA to transfer the power voltage to the light emitting element ED. Each of the light emitting elements ED may emit light by the voltage transferred by each of the connection electrodes CNE.

As described above, in the display device 10 according to the embodiments, the light emitting elements ED may be aligned even on the sides of the bank patterns BP1 and BP2, and thus the light emission area of the subpixel SPXn may be increased, and the light emitting elements ED may be prevented from being aggregated with each other. Therefore, the light emitting defect caused by a contact failure of the light emitting elements ED and the connection electrodes CNE may be reduced, and thus display quality may be improved. As the reflective layer RFL is formed in the bank patterns BP1 and BP2, light emission efficiency of the light emitting elements ED may be further improved.

Light emitting elements ED are disposed to be aligned in the via groove GRO of the via layer VIA, and a portion of the connection electrodes CNE contacts the light emitting elements ED in the via groove GRO, and thus the light emitting elements ED may be prevented from being aggregated with each other, and luminance may be improved.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
- a plurality of bank patterns comprising an insulating material and being disposed above a substrate and spaced apart from each other;
- a plurality of electrodes disposed on the substrate and extended parallel to each other and spaced apart from each other;
- an insulating layer disposed above the plurality of electrodes and the plurality of bank patterns; and
- a plurality of light emitting elements disposed above the insulating layer, having both ends disposed on the plurality of electrodes, wherein
- the plurality of bank patterns include sides facing each other, and
- portions of the plurality of light emitting elements are disposed on the sides of the plurality of bank patterns.

2. The display device of claim 1, wherein
- the plurality of bank patterns include:
  - a first bank pattern extended in a direction; and
  - a second bank pattern disposed parallel to the first bank pattern, and
- the plurality of light emitting elements are disposed on a side of the first bank pattern and a side of the second bank pattern, and between the first bank pattern and the second bank pattern.

3. The display device of claim 2, wherein the plurality of electrodes include:
- a first electrode overlapping the first bank pattern in a plan view;
- a second electrode overlapping the second bank pattern in the plan view;
- a third electrode overlapping the first bank pattern in the plan view and disposed between the first electrode and the second electrode; and
- a fourth electrode overlapping the second bank pattern in the plan view and disposed between the third electrode and the second electrode.

4. The display device of claim 3, wherein the plurality of light emitting elements include:
- a first light emitting element disposed on the first electrode and the third electrode;
- a second light emitting element disposed on the third electrode and the fourth electrode; and
- a third light emitting element disposed on the fourth electrode and the second electrode.

5. The display device of claim 4, wherein
- the first light emitting element overlaps the first bank pattern in the plan view,
- the third light emitting element overlaps the second bank pattern in the plan view, and
- the second light emitting element does not overlap the first bank pattern and the second bank pattern in the plan view.

6. The display device of claim 4, wherein
- a length direction of the first light emitting element is parallel to the side of the first bank pattern,
- a length direction of the second light emitting element is parallel to the substrate, and
- a length direction of the third light emitting element is parallel to the side of the second bank pattern.

7. The display device of claim 4, further comprising:
- a plurality of connection electrodes disposed on the plurality of electrodes,
- wherein the plurality of connection electrodes include:
  - a first connection electrode electrically contacting a first end of the first light emitting element,
  - a second connection electrode electrically contacting a first end of the third light emitting element,
  - a third connection electrode electrically contacting a second end of the first light emitting element and a first end of the second light emitting element, and
  - a fourth connection electrode electrically contacting a second end of the second light emitting element and a second end of the third light emitting element.

8. The display device of claim 7, wherein the first connection electrode and the second connection electrode are extended parallel to the plurality of electrodes.

9. The display device of claim 7, wherein the third connection electrode includes:

a first extension portion adjacent to the first connection electrode and parallel to the first connection electrode;

a second extension portion adjacent to the second connection electrode and parallel to the second connection electrode; and a first connection portion electrically connecting the first extension portion with the second extension portion, and the first extension portion electrically contacts the second end of the first light emitting element, and the second extension portion electrically contacts the first end of the second light emitting element.

10. The display device of claim 7, wherein the fourth connection electrode includes:

a third extension portion adjacent to the first connection electrode and parallel to the first connection electrode;

a fourth extension portion adjacent to the second connection electrode and parallel to the second connection electrode; and a second connection portion electrically connecting the third extension portion with the fourth extension portion, the third extension portion electrically contacts the second end of the second light emitting element, and the fourth extension portion electrically contacts the second end of the third light emitting element.

11. The display device of claim 1, wherein the plurality of bank patterns include:

bank holes that pass through the plurality of bank patterns; and reflective layers disposed inside the bank holes.

12. The display device of claim 1, wherein the plurality of bank patterns include:

bank grooves recessed in a thickness direction from upper surfaces of the plurality of bank patterns; and reflective layers disposed inside the bank grooves.

13. An electronic device comprising:

a plurality of bank patterns comprising an insulating material and being disposed above a substrate and spaced apart from each other;

a plurality of electrodes disposed on the substrate and extended parallel to each other and spaced apart from each other;

an insulating layer disposed above the plurality of electrodes and the plurality of bank patterns; and a plurality of light emitting elements disposed above the insulating layer, having both ends disposed on the plurality of electrodes, wherein the plurality of bank patterns include sides facing each other, and portions of the plurality of light emitting elements are disposed on the sides of the plurality of bank patterns.

14. The electronic device of claim 13, wherein the electronic device comprises at least one of a television, a laptop computer, a monitor, an advertising board, an Internet of things (IoT) device, a mobile phone, a smartphone, a tablet personal computer (PC), an electronic watch, a smartwatch, a watch phone, a head-mounted display, a mobile communication terminal, a digital diary, an electronic-book reader, a portable multimedia player (PMP), a navigator, a game machine, a digital camera, or a camcorder.

* * * * *